United States Patent
Gu et al.

(10) Patent No.: US 12,120,903 B2
(45) Date of Patent: Oct. 15, 2024

(54) DISPLAY SUBSTRATE, METHOD FOR MANUFACTURING SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pinchao Gu, Beijing (CN); Weiyun Huang, Beijing (CN); Donghua Jiang, Beijing (CN); Wuyang Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 927 days.

(21) Appl. No.: 17/040,486

(22) PCT Filed: Dec. 11, 2019

(86) PCT No.: PCT/CN2019/124499
§ 371 (c)(1),
(2) Date: Sep. 22, 2020

(87) PCT Pub. No.: WO2021/114128
PCT Pub. Date: Jun. 17, 2021

(65) Prior Publication Data
US 2023/0105052 A1    Apr. 6, 2023

(51) Int. Cl.
*H10K 50/844*    (2023.01)
*H05K 5/02*    (2006.01)
(Continued)

(52) U.S. Cl.
CPC ............. *H10K 50/844* (2023.02); *H05K 5/02* (2013.01); *H10K 59/65* (2023.02); *H10K 71/00* (2023.02); *H10K 59/1201* (2023.02)

(58) Field of Classification Search
CPC ...... H10K 50/844; H10K 59/65; H10K 71/00; H10K 59/1201; H05K 5/02
See application file for complete search history.

(56) References Cited

U.S. PATENT DOCUMENTS

2011/0199564 A1    8/2011    Moriwaki
2017/0148856 A1    5/2017    Choi et al.
(Continued)

FOREIGN PATENT DOCUMENTS

| CN | 109904208 A | 6/2019 |
| CN | 110164916 A * | 8/2019 ............. H01L 27/32 |

(Continued)

OTHER PUBLICATIONS

European Patent Office, Extended European Search Report Issued in Application No. 19945406.7, Nov. 9, 2022, Germany, 35 pages.
(Continued)

*Primary Examiner* — Duy Vu N Deo
*Assistant Examiner* — Christopher Remavege
(74) *Attorney, Agent, or Firm* — McCoy Russell LLP

(57) ABSTRACT

The display substrate includes a display area, a barrier wall disposing area, and a hole area, the display area surrounds the barrier wall disposing area, the barrier wall disposing area surrounds the hole area, and the method for manufacturing the display substrate includes: after a first electrode of a light emitting device of the display substrate is formed, removing a protective layer of the barrier wall disposing area, and exposing at least one circle of an initial barrier wall covered by the protective layer, the initial barrier wall is disposed around the hole area; and etching the at least one (Continued)

circle of the initial barrier wall, to form at least one circle of a barrier wall, a notch is formed on at least one side surface of the barrier wall.

19 Claims, 23 Drawing Sheets

(51) Int. Cl.
*H10K 59/12* (2023.01)
*H10K 59/65* (2023.01)
*H10K 71/00* (2023.01)

(56) References Cited

U.S. PATENT DOCUMENTS

| | | | |
|---|---|---|---|
| 2017/0162637 A1* | 6/2017 | Choi | G09G 3/3225 |
| 2019/0214600 A1* | 7/2019 | Park | H10K 50/8445 |
| 2020/0006703 A1* | 1/2020 | Zhang | H10K 59/122 |
| 2021/0126066 A1* | 4/2021 | Hwang | G06F 3/0446 |
| 2021/0159456 A1 | 5/2021 | Sun et al. | |
| 2021/0359256 A1* | 11/2021 | Du | H10K 50/844 |
| 2021/0376290 A1* | 12/2021 | Zhang | H10K 50/82 |
| 2021/0376293 A1* | 12/2021 | Zhao | H10K 71/00 |
| 2023/0020238 A1* | 1/2023 | Zhang | H10K 50/844 |

FOREIGN PATENT DOCUMENTS

| | | |
|---|---|---|
| CN | 110429118 A | 11/2019 |
| JP | 2010092665 A | 4/2010 |
| WO | 2010038514 A1 | 4/2010 |

OTHER PUBLICATIONS

Japanese Patent Office, Office Action Issued in Application No. 2021-572441, Aug. 29, 2023, 13 pages. (Submitted with Machine Translation).

* cited by examiner

DISPLAY SUBSTRATE, METHOD FOR MANUFACTURING SAME, AND DISPLAY APPARATUS

CROSS-REFERENCE TO RELATED APPLICATION

The present application is a U.S. National Phase of International Patent Application Serial No. PCT/CN2019/124499 entitled "DISPLAY SUBSTRATE, METHOD FOR MANUFACTURING SAME, AND DISPLAY APPARATUS," filed on Dec. 11, 2019. The entire contents of each of the above-referenced applications are hereby incorporated by reference for all purposes.

TECHNICAL FIELD

The present disclosure relates to the field of display technologies, and in particular, to a display substrate, a method for manufacturing the same, and a display apparatus.

BACKGROUND AND SUMMARY

At present, display screens of display devices are developing towards larger screens and full screens. Generally, a display device (such as a mobile phone or a tablet computer) has a camera apparatus (or an imaging apparatus), and the camera apparatus is usually disposed on a side outside a display area of a display screen. However, the camera apparatus needs to be installed at a certain position, which is not conducive to a full-screen and narrow-frame design of the display screen. For example, the camera apparatus may be combined together with the display area of the display screen to reserve a position for the camera apparatus in the display area, to maximize the display area of the display screen.

An embodiment of the present disclosure provides a method for manufacturing a display substrate, wherein the display substrate includes a display area, a barrier wall disposing area, and a hole area, the display area surrounds the barrier wall disposing area, the barrier wall disposing area surrounds the hole area, and the method includes: after a first electrode of a light emitting device of the display substrate is formed, removing a protective layer of the barrier wall disposing area, and exposing at least one circle of an initial barrier wall covered by the protective layer, wherein the initial barrier wall is disposed around the hole area; and etching the at least one circle of the initial barrier wall, to form at least one circle of a barrier wall, wherein a notch is formed on at least one side surface of the barrier wall.

Optionally, before the removing a protective layer, covering an initial barrier wall, of the barrier wall disposing area, the method further includes: forming, in the barrier wall disposing area, the at least one circle of the initial barrier wall surrounding the hole area; and forming the protective layer covering the initial barrier wall.

Optionally, the manufacturing method further includes: forming a conductive pattern of the display substrate while the initial barrier wall is formed, wherein the conductive pattern and the initial barrier wall are formed by using a same film layer.

Optionally, the forming the initial barrier wall and a conductive pattern includes: forming a first metal material layer on a first side of a base substrate of the display substrate, and forming a second metal material layer on a side, away from the base substrate, of the first metal material layer; and performing first etching on the first metal material layer and the second metal material layer, to form the conductive pattern and the initial barrier wall.

Optionally, the etching the at least one circle of the initial barrier wall, to form at least one circle of a barrier wall includes: performing wet etching on the initial barrier wall, wherein an etch rate at which the first metal material layer is etched by using an etchant is greater than an etch rate at which the second metal material layer is etched by using the etchant, and therefore, the notch is formed.

Optionally, the forming the initial barrier wall and a conductive pattern includes: sequentially forming a third metal material layer, a first metal material layer, and a second metal material layer on a first side of a base substrate of the display substrate; and performing first etching on the third metal material layer, the first metal material layer, and the second metal material layer, to form the conductive pattern and the initial barrier wall.

Optionally, the etching the at least one circle of the initial barrier wall, to form at least one circle of a barrier wall includes: performing wet etching on the initial barrier wall, wherein an etch rate at which the first metal material layer is etched by using an etchant is greater than an etch rate at which the second metal material layer is etched by using the etchant and an etch rate at which the third metal material layer is etched by using the etchant, and therefore, the notch is formed.

Optionally, the first etching is dry etching.

Optionally, the removing a protective layer of the barrier wall disposing area includes: coating a photoresist on the display substrate on which the first electrode is formed, and exposing the photoresist by using a mask, wherein the mask includes a translucent pattern corresponding to the barrier wall disposing area; removing the photoresist of the barrier wall disposing area after development; and performing dry etching on the protective layer of the barrier wall disposing area by using a remaining photoresist as a mask, removing the protective layer of the barrier wall disposing area, and exposing the initial barrier wall.

Optionally, the mask further includes a translucent pattern corresponding to the hole area, and while the photoresist of the barrier wall disposing area is removed after development, a photoresist of the hole area is further removed.

Optionally, the forming a conductive pattern of the display substrate while the initial barrier wall is formed includes: while the initial barrier wall is formed, forming a first source-drain metal layer pattern of the display substrate; or while the initial barrier wall is formed, forming a second source-drain metal layer pattern of the display substrate.

Optionally, the forming the protective layer covering the initial barrier wall includes: forming a passivation layer or a planarization layer covering the initial barrier wall.

Optionally, after the forming at least one circle of a barrier wall, the method further includes: forming an organic function layer of the light emitting device, wherein the organic function layer is disconnected on the side surface, on which the notch is provided, of the barrier wall; forming a second electrode of the light emitting device; and forming a packaging thin film layer covering the display substrate on which the light emitting device is formed.

Optionally, the hole area is formed through laser cutting or mechanical stamping.

An embodiment of the present disclosure provides a display substrate, obtained through manufacturing by using the manufacturing method described above, wherein the display substrate includes a display area, a barrier wall disposing area, and a hole area, the display area surrounds the barrier wall disposing area, the barrier wall disposing area surrounds the hole area, at least one circle of a barrier wall surrounding the hole area is disposed in the barrier wall disposing area, and a notch is formed on at least one side surface of the barrier wall.

Optionally, the barrier wall includes: a first metal pattern, on a first side of a base substrate of the display substrate; and a second metal pattern, on a side, away from the base substrate, of the first metal pattern, wherein an orthogonal projection of the first metal pattern on the base substrate falls within an orthogonal projection of the second metal pattern on the base substrate, and therefore, the notch is formed.

Optionally, the barrier wall further includes: a third metal pattern, wherein the third metal pattern is disposed on the first side of the base substrate, wherein the first metal pattern is on a side, away from the base substrate, of the third metal pattern, and the orthogonal projection of the first metal pattern on the base substrate falls within an orthogonal projection of the third metal pattern on the base substrate.

Optionally, a thickness of the first metal pattern is greater than a thickness of the second metal pattern and a thickness of the third metal pattern.

Optionally, the thickness of the first metal pattern is 150 nm to 900 nm, the thickness of the second metal pattern is 30 nm to 300 nm, and the thickness of the third metal pattern is 30 nm to 300 nm.

Optionally, a material of the first metal pattern includes aluminum or copper; and a material of the second metal pattern includes titanium or molybdenum.

Optionally, an opening direction of the notch is parallel to a base substrate of the display substrate.

Optionally, the display substrate further includes an image sensor and/or an infrared sensor, the image sensor and/or the infrared sensor are integrated on a base substrate of the display substrate, and an orthogonal projection on the base substrate at least partially overlaps the hole area.

An embodiment of the present disclosure provides a display apparatus, including the display substrate described above.

BRIEF DESCRIPTION OF THE DRAWINGS

To describe technical solutions in the embodiments of the present disclosure more clearly, accompanying drawings of the embodiments are briefly described below. It is obvious that the accompanying drawings described below are only some embodiments of the present disclosure, rather than limiting the present disclosure.

DETAILED DESCRIPTION

To make objectives, technical solutions, and advantages of the embodiments of the present disclosure clearer, the technical solutions of the embodiments of the present disclosure are described below clearly and completely with reference to the accompanying drawings of the embodiments of the present disclosure. Obviously, the described embodiments are some rather than all of the embodiments of the present disclosure. Based on the described embodiments of the present disclosure, all other embodiments obtained by a person skilled in the art without creative efforts fall within the protection scope of the present disclosure.

Unless otherwise defined, all technical terms or scientific terms used in the present disclosure should be the ordinary meanings understood by a person skilled in the art to which the present disclosure belongs. The "first", "second", and similar words used in the present disclosure do not indicate any order, number, or importance, but are only used for distinguishing different components. Similar words such as "include" and "comprise" mean that elements or objects appearing before the word cover elements or objects and their equivalents listed after the word, but do not exclude other elements or objects. Similar words such as "connected" and "coupled" are not limited to a physical or mechanical connection, but may include an electrical connection, whether direct or indirect. "up", "down", "left", "right", or the like is only used to indicate a relative position relationship. When an absolute position of a described object changes, the relative position relationship may also change accordingly.

To maximize a display area of a display apparatus, a camera apparatus (an imaging apparatus) of the display apparatus may be integrated together with the display area, and the camera apparatus is disposed in the display area.

Figure 1A:
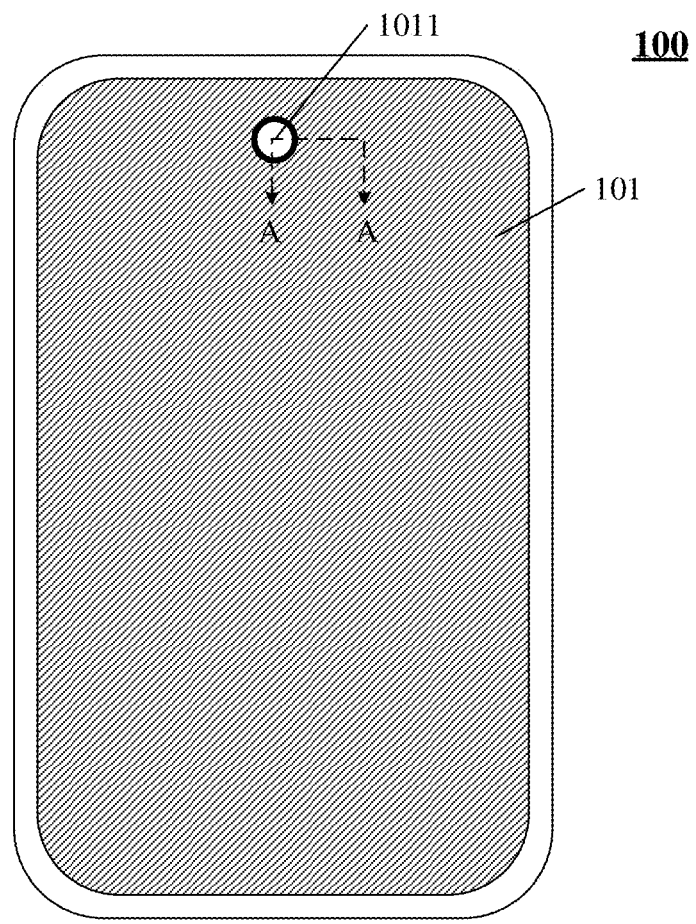
FIG. 1A is a schematic plan view of a display substrate.
Figure 1B:
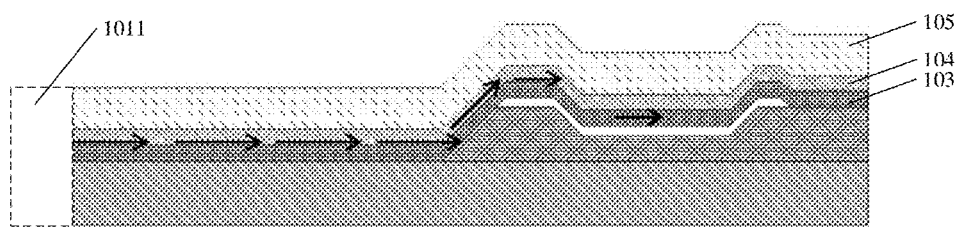
FIG. 1B is a schematic sectional view of the display substrate in FIG. 1A along a line A-A.

For example, FIG. 1A is a schematic plan view of a display substrate used for a display apparatus, and FIG. 1B is a schematic sectional view of the display substrate in FIG. 1A along a line A-A. As shown in FIG. 1A, a display substrate 100 includes a display area 101, the display area 101 includes a pixel array and a hole 1011 in the pixel array, the hole 1011 is a position reserved for a camera apparatus (not shown), and the camera apparatus may be disposed on a back side, opposite to a display side, of the display substrate 100, so that the camera apparatus may obtain an image through the hole 1011. Therefore, the camera apparatus and the display area 101 of the display substrate 100 are integrated together.

A light emitting device used for display is disposed in the display area 101. For example, the light emitting device is an organic light emitting diode. Organic function layers 103 and cathode layers 104 of a plurality of light emitting devices in all or a part of the display area 101 are usually formed as an entire surface in the display area 101. Therefore, when packaging is performed by using a packaging layer 105, it is often difficult to package an area located near the hole 1011, or even if the area is packaged, it is also difficult to ensure a packaging effect of the area. In this case, as shown in FIG. 1B, impurities such as water and oxygen can enter the display area 101 from the hole 1011 along the organic function layers 103 and the cathode layers 104 that are formed as the entire surface, thereby polluting function materials in the display area 101, and resulting in degradation of the performance of these function materials, which affects a display effect of the display area 101.

Figure 2A:
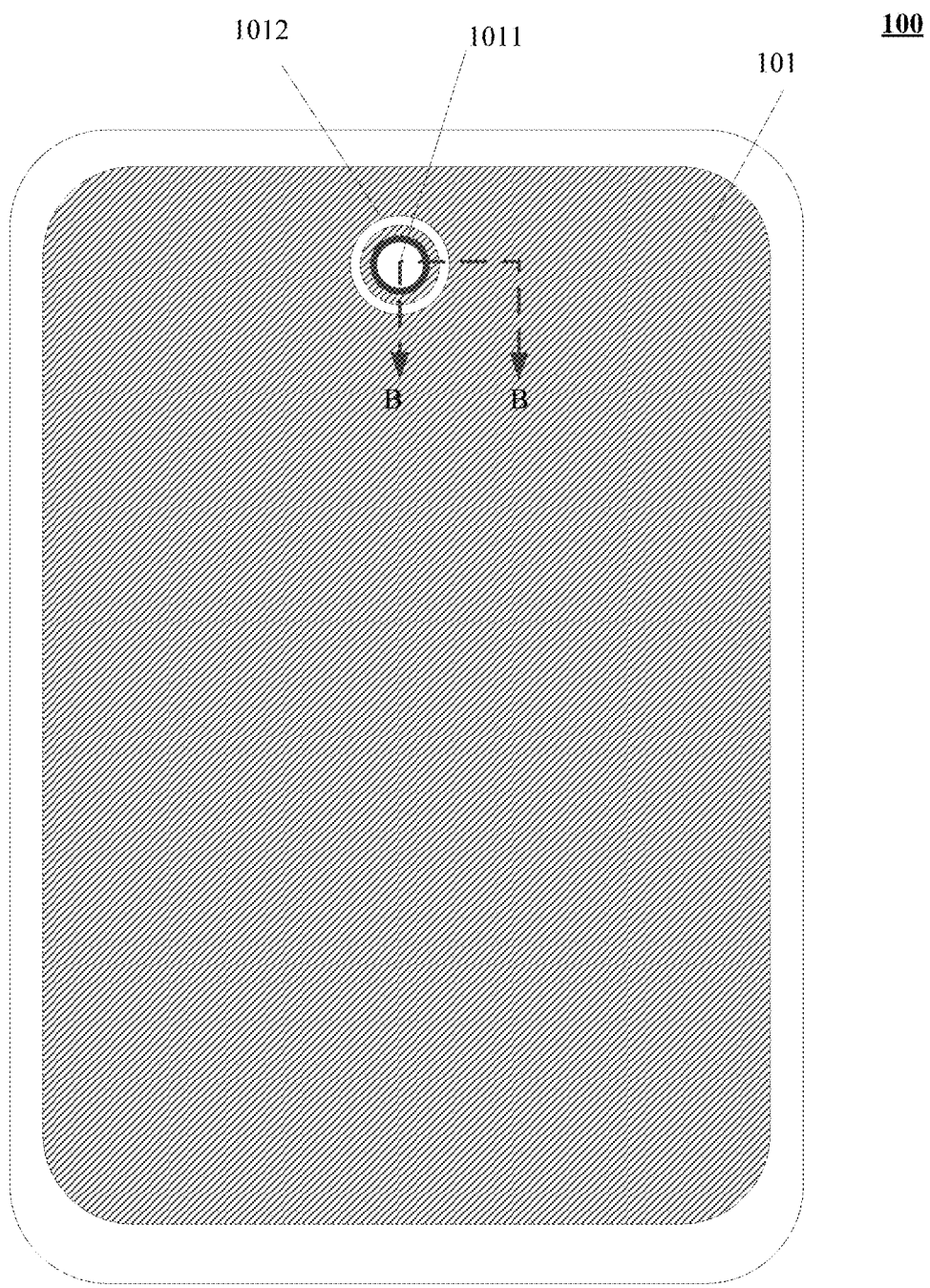
FIG. 2A is a schematic plan view of a display substrate.
Figure 2B:
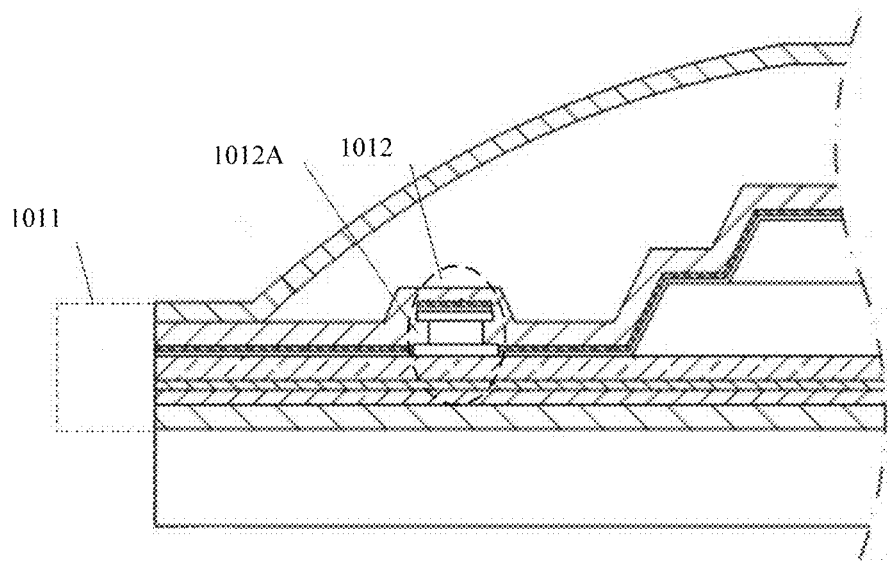
FIG. 2B is a schematic sectional view of the display substrate in FIG. 2A along a line B-B.

To ensure the display effect of the display area, as shown in FIG. 2A, a barrier wall 1012 may be disposed around the hole area 1011, the display substrate 100 includes the display area 101 and the hole area 1011, and the display area 101 surrounds the hole area 1011. The barrier wall 1012 surrounds the hole area 1011. FIG. 2B is a schematic sectional view of the display substrate in FIG. 2A along a line B-B. It may be seen from FIG. 2B that at least one side surface, surrounding the hole area 1011, of the barrier wall 1012 is provided with a notch 1012A. Each of a side surface, facing the hole area 1011, of the barrier wall 1012 and a side surface facing away from the hole area 1011 may be provided with a notch 1012A, or one side surface of the barrier wall 1012 is provided with a notch 1012A. In this way, the organic function layers and the cathode layers 104 formed as the entire surface are disconnected on the side surface, provided with the notch 1012A, of the barrier wall 1012. In this way, when the organic function layer and the cathode layer 104 located on a side proximal to the hole area 1011 are polluted by impurities such as water and oxygen, the organic function layer and the cathode layer 104 are separated by the barrier wall 1012, so that these pollution impurities do not extend to a part, used by the light emitting device for light emitting, of the organic function layer and the cathode layer 104. For example, a part of organic function layer and a part of cathode layer 104 are also formed on a top of the barrier wall 1012, but these parts are separated from other parts.

Figure 2C:
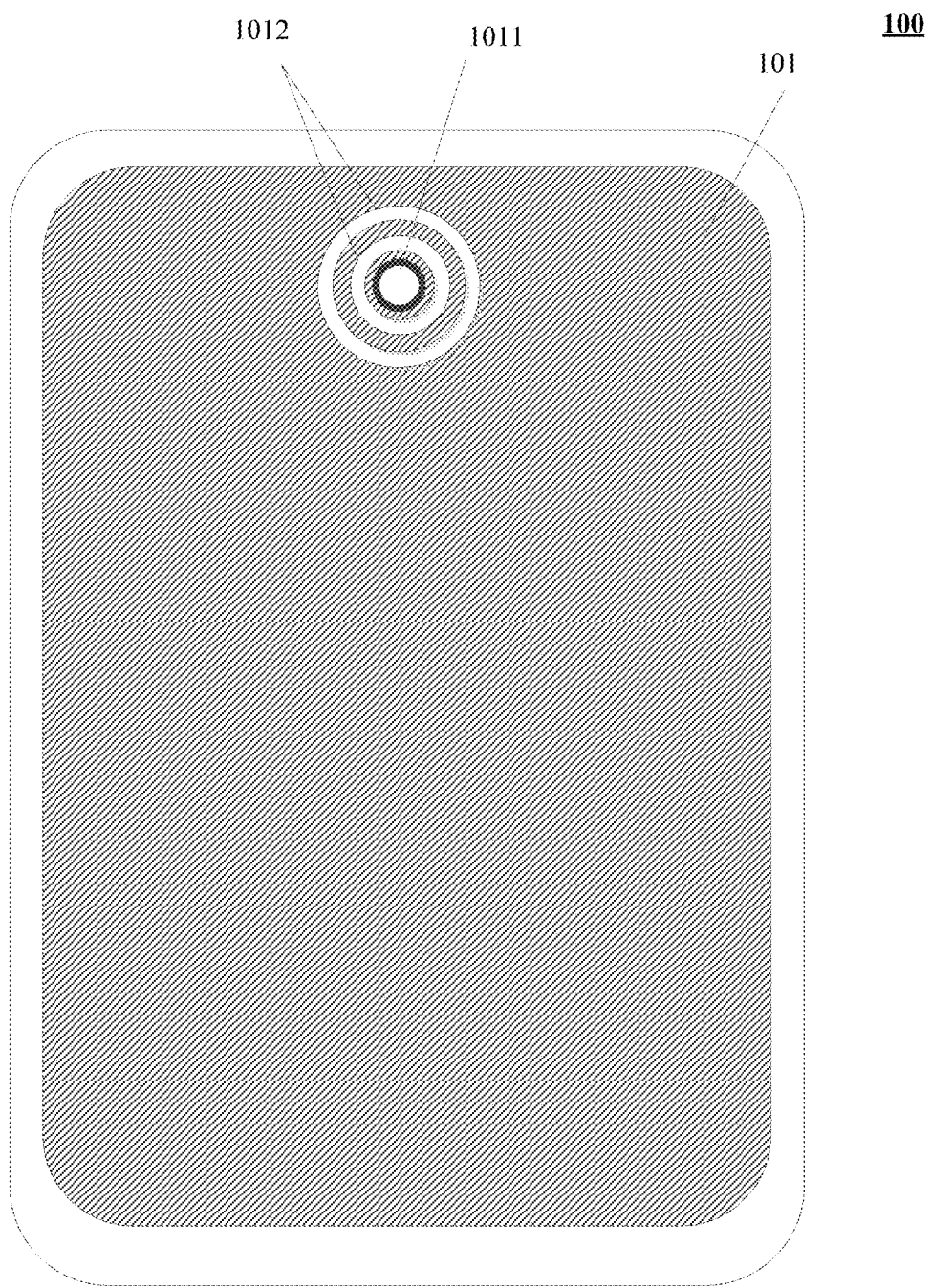
FIG. 2C is a schematic plan view of another display substrate.

To further enhance a barrier effect, as shown in FIG. 2C, more than one layer of barrier wall may be further disposed around the hole area 1011, that is, a plurality of layers of barrier walls may be included, for example, two layers, three layers, four layers, or five layers are disposed to enhance the barrier effect.

Figure 3A:
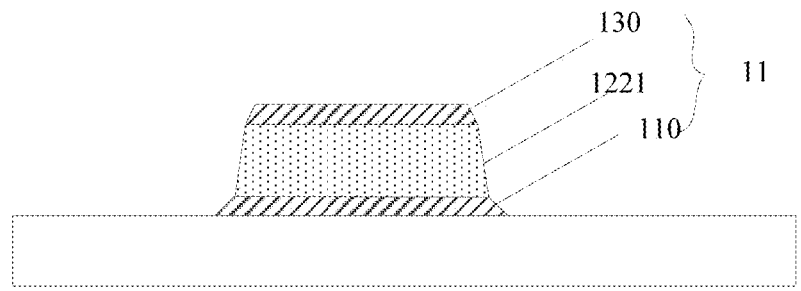
FIG. 3A is a schematic diagram after an initial barrier wall is formed.
Figure 3B:
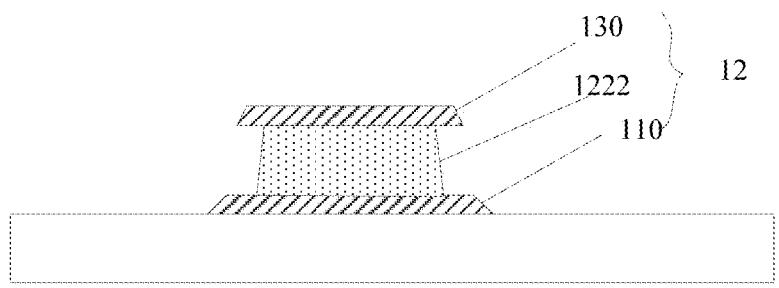
FIG. 3B is a schematic diagram after a barrier wall is formed.

To simplify a manufacturing process and a structure of the display substrate, the barrier wall 1012 may be formed by using a metal layer structure of the display substrate. For example, a metal layer structure Ti/Al/Ti exists on the display substrate, and an electrode and a signal line of the display substrate may be formed by using the metal layer structure. As shown in FIG. 3A, an initial barrier wall 11 may be formed around the hole area 1011 by using the metal layer structure. The initial barrier wall 11 includes a Ti layer 110, an Al layer 1221, and a Ti layer 130 that are stacked in sequence. Then, when an anode of the display substrate is formed, an anode etchant has an etching effect on the Al layer 1221, and the Al layer 1221 is etched by using the anode etchant to form an etched Al layer 1222. As shown in FIG. 3B, the Ti layer 110, the Al layer 1222, and the Ti layer 130 are sequentially stacked to form a barrier wall 12. An orthogonal projection of the Al layer 1222 on a base substrate of the display substrate falls within an orthogonal projection of the Ti layer 130 on the base substrate of the display substrate, and the orthogonal projection of the Al layer 1222 on the base substrate of the display substrate falls within an orthogonal projection of the Ti layer 110 on the base substrate of the display substrate. In this way, a notch may be formed on a side surface of the barrier wall 12. When vapor deposition is subsequently performed on an organic light emitting layer and a cathode layer on the base substrate on which the barrier wall 12 is formed, the organic light emitting layer and the cathode layer are disconnected on the side surface, on which the notch is provided, of the barrier wall 12. Therefore, when an organic function layer and a cathode layer located on a side proximal to the hole area are polluted by impurities such as water and oxygen, the organic function layer and the cathode layer are separated by the barrier wall 12, so that these pollution impurities do not extend to a part, used by the light emitting device for light emitting, of the organic function layer and the cathode layer.

Figure 3C:
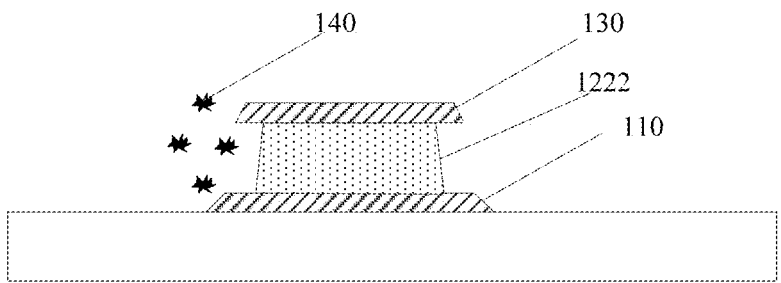
FIG. 3C is a schematic diagram of forming Ag particles.

The anode of the display substrate uses an ITO/Ag/ITO stacked structure in most cases. When the ITO/Ag/ITO stacked structure is etched by using the anode etchant, dissolution of Ag ions is caused in the anode etchant. When the anode etchant in which the Ag ions are dissolved etches the Al layer 1221, the Ag ions in the anode etchant make a replacement reaction with Al. As shown in FIG. 3C, Ag particles 140 with a diameter of 1 um to 5 um are formed. The Ag particles 140 flow in the anode etchant and diffuse to various areas of the display substrate. The Ag particle 140 has strong adhesion, adheres to the display substrate, and eventually becomes a conductive dark spot, thereby affecting the display effect of the display substrate.

To resolve the foregoing problem, the embodiments of the present disclosure provide a display substrate, a method for manufacturing the same, and a display apparatus, which can ensure the display effect of the display substrate.

An embodiment of the present disclosure provides a method for manufacturing a display substrate, wherein the display substrate includes a display area, a barrier wall disposing area, and a hole area, the display area surrounds the barrier wall disposing area, the barrier wall disposing area surrounds the hole area, and the manufacturing method includes: after a first electrode of a light emitting device of the display substrate is formed, removing a protective layer of the barrier wall disposing area, and exposing at least one circle of an initial barrier wall covered by the protective layer, wherein the initial barrier wall is disposed around the hole area; and etching the at least one circle of the initial barrier wall, to form at least one circle of a barrier wall, wherein a notch is formed on at least one side surface of the barrier wall.

In this embodiment, after the first electrode is formed, the protective layer covering the initial barrier wall is then removed. In this way, when a first electrode material layer is etched by using an etchant of the first electrode, because the initial barrier wall is covered by the protective layer, the initial barrier wall does not come into contact with the etchant of the first electrode, which eliminates a possibility of a replacement reaction of metal ions in the etchant of the first electrode, and avoids formation of a conductive particle on the display substrate, so that quality of the display substrate can be ensured. After the first electrode is formed, the protective layer is then removed and the initial barrier wall is etched, to form a barrier wall with the notch on the side surface.

Optionally, before the removing a protective layer, covering an initial barrier wall, of the barrier wall disposing area, the manufacturing method further includes: forming, in the barrier wall disposing area, the at least one circle of the initial barrier wall surrounding the hole area; and forming the protective layer covering the initial barrier wall.

To form the barrier wall with the notch, the initial barrier wall may use a metal layer structure. The metal layer structure includes at least two stacked metal material layers, wherein the at least two metal material layers have different etch rates in a same etchant. In this way, after the initial barrier wall is etched by using the etchant, the barrier wall with the notch on the side surface may be formed.

A conductive pattern of the display substrate, such as a signal line and an electrode, is made of the metal layer structure in most cases. To simplify the method for manufacturing the display substrate, the initial barrier wall may be formed while the conductive pattern of the display substrate is formed. In a specific embodiment, the manufacturing method further includes: forming a conductive pattern of the display substrate while the initial barrier wall is formed, wherein the conductive pattern and the initial barrier wall are formed by using a same film layer.

For example, the initial barrier wall uses a first metal layer structure, the conductive pattern of the display substrate uses a second metal layer structure, and the first metal layer structure and the second metal layer structure have a same structure and use a same material. For example, the first metal layer structure and the second metal layer structure can be formed at a same layer and have the same multilayer structure in a manufacturing process. In the first metal layer structure and the second metal multilayer structure, materials of corresponding layers are the same. Therefore, the first metal layer structure and the second metal layer structure can be formed by using the same film layer.

In a specific embodiment, the initial barrier wall may use a metal layer structure including first metal material layer and a second metal material layer, and the forming the initial barrier wall and the conductive pattern includes: forming a first metal material layer on a first side of a base substrate of the display substrate, and forming a second metal material layer on a side, away from the base substrate, of the first metal material layer; and performing first etching on the first metal material layer and the second metal material layer, to form the conductive pattern and the initial barrier wall.

The first etching may be wet etching or dry etching.

Figure 4A:
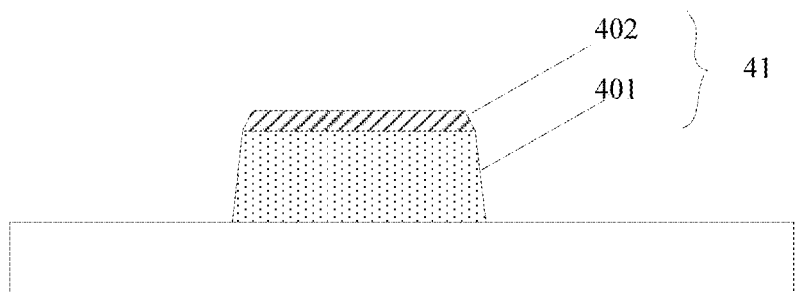
FIG. 4A is a schematic diagram after an initial barrier wall is formed provided by an embodiment of the present disclosure.

In a specific example, as shown in FIG. 4A, after the first etching is performed on the first metal material layer and the second metal material layer, an initial barrier wall 41 is formed on the first side of the base substrate of the display substrate. The initial barrier wall 41 includes a first initial metal pattern 401 and a second metal pattern 402. When materials of the first metal material layer and the second metal material layer are selected, it is necessary to satisfy that an etch rate of the first metal material layer in a specific etchant is greater than an etch rate of the second metal material layer in the specific etchant. When first etching is wet etching, an etchant used during first etching is not the specific etchant, and the etch rates of the first metal material layer and the second metal material layer in the etchant used during the first etching are the same or similar. In this way, no notch is formed on a side surface of the initial barrier wall. After the protective layer covering the initial barrier wall 41 is subsequently formed, the protective layer is not disconnected on the side surface of the initial barrier wall 41 and can cover the side surface of the initial barrier wall 41, thereby protecting the initial barrier wall 41.

Figure 4B:
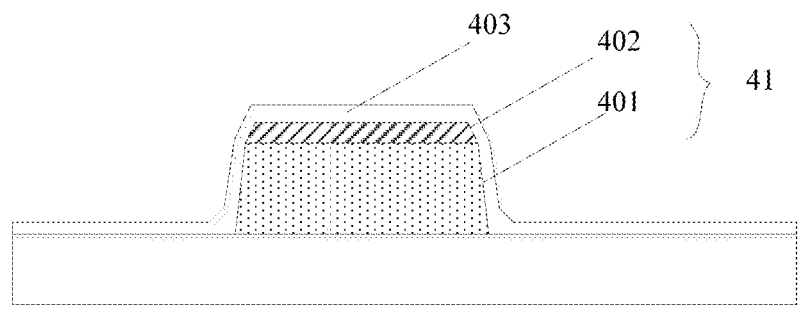
FIG. 4B is a schematic diagram after a protective layer is formed provided by an embodiment of the present disclosure.

After the initial barrier wall 41 is formed, as shown in FIG. 4B, a protective layer 403 covering the initial barrier wall 41 is formed. The protective layer 403 may use an inorganic insulating material or an organic insulating material. To simplify a manufacturing process of the display substrate, the protective layer 403 and an insulating film layer of the display substrate may be formed at the same time and use a same material. For example, the protective layer 403 and a planarization layer of the display substrate may be formed at the same time and use a same material; or the protective layer 403 and a passivation layer of the display substrate may be formed at the same time and use a same material.

After the protective layer 403 is formed, another structure of the display substrate may be manufactured, such as an anode of the display substrate. Specifically, an anode material layer may be formed on the base substrate of the display substrate, a photoresist is coated on the anode material layer, and the photoresist is exposed by using a mask. After development, a photoresist reservation area and a photoresist removal area are formed. The photoresist reservation area corresponds to an area in which a pattern of the anode is located, and the photoresist removal area corresponds to another area outside the pattern of the anode. The anode material layer that is not covered by the photoresist is etched away by using an anode etchant, and then a remaining photoresist is peeled off, to form the pattern of the anode. In a process of performing etching by using the anode etchant, because the protective layer 403 covers the initial barrier wall 41, the anode etchant does not come into contact with the initial barrier wall 41, which prevents formation of a conductive metal particle on the display substrate due to occurrence of a replacement reaction of metal ions in the anode etchant.

After the pattern of the anode is formed and the anode etchant is cleaned, the protective layer 403 is removed. Specifically, the protective layer 403 may be removed through dry etching. In this way, introduction of an etchant can be avoided during the removal of the protective layer 403 and the etchant is prevented from causing uncontrollable damage to the initial barrier wall 41.

In a specific example, the removing the protective layer of the barrier wall disposing area includes: coating a photoresist on the display substrate on which the first electrode is formed, and exposing the photoresist by using a mask, wherein the mask includes a translucent pattern corresponding to the barrier wall disposing area; removing the photoresist of the barrier wall disposing area after development; and performing dry etching on the protective layer of the barrier wall disposing area by using a remaining photoresist as a mask, removing the protective layer of the barrier wall disposing area, and exposing the initial barrier wall.

Optionally, the mask further includes a translucent pattern corresponding to the hole area, and while the photoresist of the barrier wall disposing area is removed after development, a photoresist of the hole area is further removed.

Figure 4C:
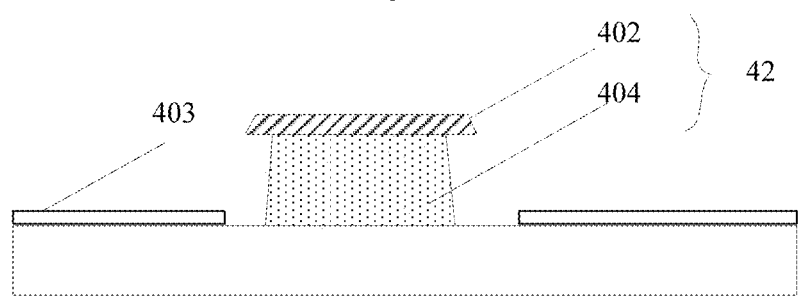
FIG. 4C is a schematic diagram after a barrier wall is formed provided by an embodiment of the present disclosure.

As shown in FIG. 4C, after the protective layer 403 is removed, wet etching may be performed on the initial barrier wall 41. For an etchant used during wet etching, it is necessary to satisfy that an etch rate of the first metal material layer is greater than an etch rate of the second metal material layer. In this way, an etched part of the first initial metal pattern 401 is more than an etched part of the second metal pattern 402, thereby forming a barrier wall 42 with a notch on a side surface. In a specific example, the etchant used during wet etching can etch only the first metal material layer, but does not etch the second metal material layer. In this way, after wet etching is performed on the initial barrier wall 41 by using the etchant, the second metal pattern 402 is reserved. After a part of the first initial metal pattern 401 is removed, a first metal pattern 404 is formed, the first metal pattern 404 and the second metal pattern 402 form the barrier wall 42, and an orthogonal projection of the first metal pattern 404 on the base substrate of the display substrate falls within an orthogonal projection of the second metal pattern 402 on the base substrate of the display substrate, thereby forming the notch.

In another specific embodiment, the initial barrier wall may use a metal layer structure including the first metal material layer, the second metal material layer, and a third metal material layer, and the forming the initial barrier wall and the conductive pattern includes: sequentially forming the third metal material layer, the first metal material layer, and the second metal material layer on the first side of the base substrate of the display substrate; and performing first etching on the third metal material layer, the first metal material layer, and the second metal material layer, to form the conductive pattern and the initial barrier wall.

The first etching may be wet etching or dry etching.

Figure 5A:
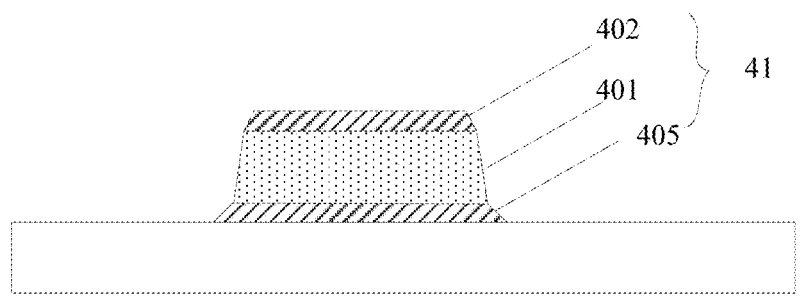
FIG. 5A is a schematic diagram after an initial barrier wall is formed according to another embodiment of the present disclosure.

In a specific example, as shown in FIG. 5A, after the first etching is performed on the third metal material layer, the first metal material layer, and the second metal material layer, the initial barrier wall 41 is formed on the first side of the base substrate of the display substrate. The initial barrier wall 41 includes the first initial metal pattern 401, the second metal pattern 402, and a third metal pattern 405. When materials of the first metal material layer, the second metal material layer and the third metal material layer are selected, it is necessary to satisfy that an etch rate of the first metal material layer in a specific etchant is greater than an etch rate of the second metal material layer in the specific etchant, and the etch rate of the first metal material layer in the specific etchant is greater than an etch rate of the third metal material layer in the specific etchant. The second metal material layer and the third metal material layer may use a same material.

When the first etching is wet etching, an etchant used during the first etching is not the specific etchant, and the etch rates of the first metal material layer, the second metal material layer, and the third metal material layer in the etchant used during the first etching are the same or similar. In this way, no notch is formed on the side surface of the initial barrier wall 41. After the protective layer 403 covering the initial barrier wall 41 is subsequently formed, the protective layer 403 is not disconnected on the side surface of the initial barrier wall 41 and can cover the side surface of the initial barrier wall 41, thereby protecting the initial barrier wall 41.

Figure 5B:
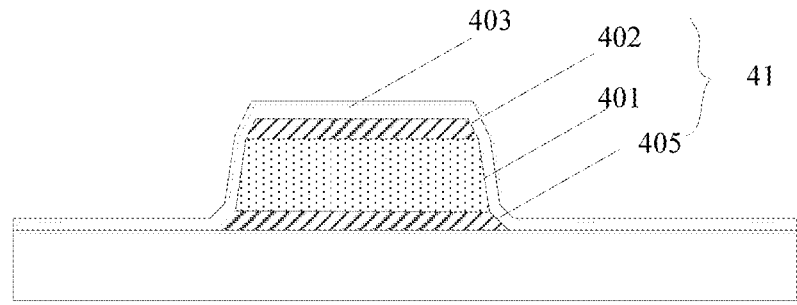
FIG. 5B is a schematic diagram after a protective layer is formed according to another embodiment of the present disclosure.

After the initial barrier wall 41 is formed, as shown in FIG. 5B, a protective layer 403 covering the initial barrier wall 41 is formed. The protective layer 403 may use an inorganic insulating material or an organic insulating material. To simplify a manufacturing process of the display substrate, the protective layer 403 and an insulating film layer of the display substrate may be formed at the same time and use a same material. For example, the protective layer 403 and a planarization layer of the display substrate may be formed at the same time and use a same material; or the protective layer 403 and a passivation layer of the display substrate may be formed at the same time and use a same material.

After the protective layer 403 is formed, another structure of the display substrate may be manufactured, such as an anode of the display substrate. Specifically, an anode material layer may be formed on the base substrate of the display substrate, a photoresist is coated on the anode material layer, and the photoresist is exposed by using a mask. After development, a photoresist reservation area and a photoresist removal area are formed. The photoresist reservation area corresponds to an area in which a pattern of the anode is located, and the photoresist removal area corresponds to another area outside the pattern of the anode. The anode material layer that is not covered by the photoresist is etched away by using an anode etchant, and then a remaining photoresist is peeled off, to form the pattern of the anode. In a process of performing etching by using the anode etchant, because the protective layer 403 covers the initial barrier wall 41, the anode etchant does not come into contact with the initial barrier wall 41, which prevents formation of a conductive metal particle on the display substrate due to occurrence of a replacement reaction of metal ions in the anode etchant.

After the pattern of the anode is formed and the anode etchant is cleaned, the protective layer 403 is removed. Specifically, the protective layer 403 may be removed through dry etching. In this way, introduction of an etchant can be avoided during the removal of the protective layer 403 and the etchant is prevented from causing uncontrollable damage to the initial barrier wall 41.

In a specific example, the removing the protective layer of the barrier wall disposing area includes: coating a photoresist on the display substrate on which the first electrode is formed, and exposing the photoresist by using a mask, wherein the mask includes a translucent pattern corresponding to the barrier wall disposing area; removing the photoresist of the barrier wall disposing area after development; and performing dry etching on the protective layer of the barrier wall disposing area by using a remaining photoresist as a mask, removing the protective layer of the barrier wall disposing area, and exposing the initial barrier wall.

Optionally, the mask further includes a translucent pattern corresponding to the hole area, and while the photoresist of the barrier wall disposing area is removed after development, a photoresist of the hole area is further removed.

Figure 5C:
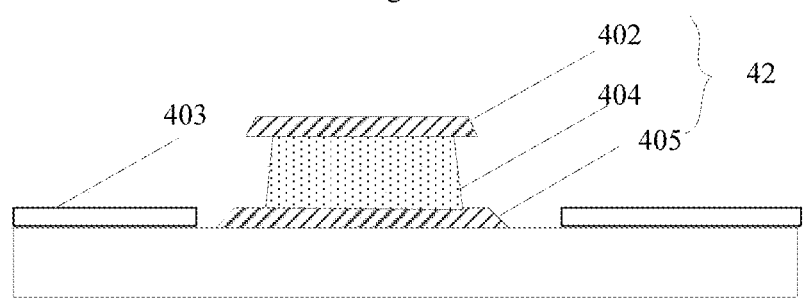
FIG. 5C is a schematic diagram after a barrier wall is formed according to another embodiment of the present disclosure.

As shown in FIG. 5C, after the protective layer 403 is removed, wet etching may be performed on the initial barrier wall 41. For an etchant used during wet etching, it is necessary to satisfy that an etch rate of the first metal material layer is greater than an etch rate of the second metal material layer, and the etch rate of the first metal material layer is greater than an etch rate of the third metal material layer. In this way, an etched part of the first initial metal pattern 401 is more than an etched part of the second metal pattern 402, and is more than an etched part of the third metal pattern 405, thereby forming a barrier wall 42 with a notch on a side surface.

In a specific example, the etchant used during wet etching can etch only the first metal material layer, but does not etch the second metal material layer and the third metal material layer. In this way, after wet etching is performed on the initial barrier wall 41 by using the etchant, the second metal pattern 402 and the third metal pattern 405 are reserved. After a part of the first initial metal pattern 401 is removed, a first metal pattern 404 is formed, and the first metal pattern 404, the second metal pattern 402, and the third metal pattern 405 form the barrier wall 42. An orthogonal projection of the first metal pattern 404 on the base substrate of the display substrate falls within an orthogonal projection of the second metal pattern 402 on the base substrate of the display substrate, and the orthogonal projection of the first metal pattern 404 on the base substrate of the display substrate falls within an orthogonal projection of the third metal pattern 405 on the base substrate of the display substrate, thereby forming the notch.

The foregoing specific embodiments are described by taking the barrier wall including two layers of metal patterns and three layers of metal patterns as an example. However, the barrier wall in the present disclosure is not limited to including the two layers of metal patterns and the three layers of metal patterns, and may also include more layers of metal patterns.

After the at least one circle of the barrier wall 42 is formed by using the above method, the organic function layer of the light emitting device may be formed, and the organic function layer is disconnected on the side surface, on which the notch is provided, of the barrier wall 42. A second electrode of the light emitting device is formed, such as a cathode that is disconnected on the side surface, on which the notch is provided, of the barrier wall 42. In this way, when the organic function layer and the cathode layer located on the side proximal to the hole area are polluted by impurities such as water and oxygen, the organic function layer and the cathode layer are separated by the barrier wall 42, so that these pollution impurities do not extend to the part, used by the light emitting device for light emitting, of the organic function layer and the cathode layer, thereby affecting display of the display substrate.

Then a packaging thin film layer covering the display substrate on which the light emitting device is formed may be further formed. The packaging thin film layer may include a first packaging layer, a second packaging layer, and a third packaging layer that are stacked in sequence. The first packaging layer may be formed on the cathode layer through chemical vapor deposition, physical vapor deposition, or coating. The first packaging layer can provide packaging and protection to a functional structure located in the display area. The second packaging layer may planarize the first packaging layer, and the third packaging layer may form outer packaging. The first packaging layer and the third packaging layer may use inorganic materials, such as silicon nitride, silicon oxide, or silicon oxynitride. The second packaging layer may use an organic material, such as polyimide (PI) or epoxy resin. As a result, the first packaging layer, the second packaging layer and the third packaging layer form a composite thin film packaging layer, which forms multi-protection for the functional structure in the display area and has a better packaging effect.

After packaging the display substrate is completed, the hole area may be formed through laser cutting or mechanical stamping.

In a specific embodiment, the display substrate includes an active layer, a first gate metal layer, a gate insulating layer, a second gate metal layer, an interlayer insulating layer, a first source-drain metal layer, a passivation layer, a first planarization layer, a second source-drain metal layer, a second planarization layer, an anode, and a pixel defining layer that are sequentially disposed on the first side of the base substrate. To simplify the manufacturing process and the structure of the display substrate, the initial barrier wall may be manufactured by using the first gate metal layer, the second gate metal layer, the first source-drain metal layer, or the second source-drain metal layer.

Figure 4D:
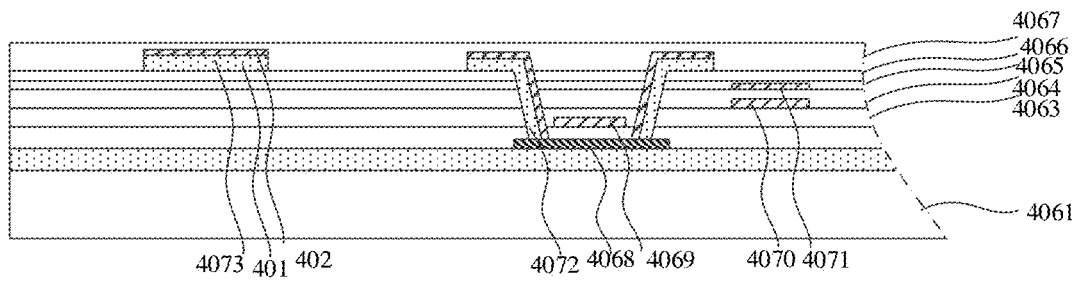
FIG. 4D to FIG. 4H are schematic flowcharts of manufacturing a display substrate provided by an embodiment of the present disclosure.
Figure 4E:
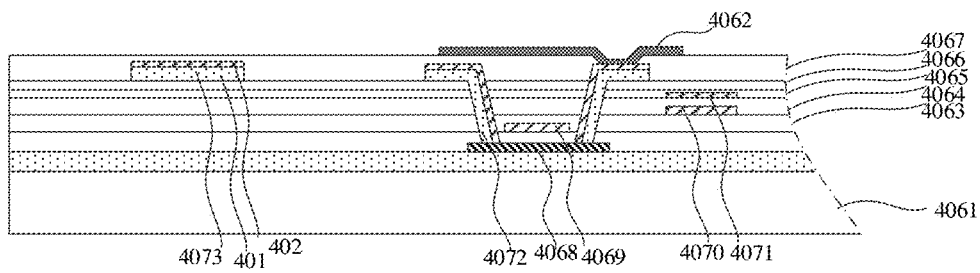
Figure 4F:
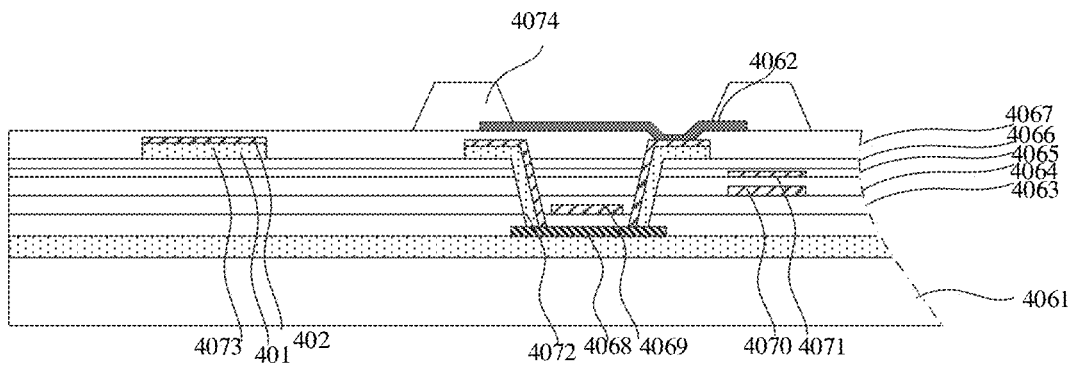

In a specific example, when the initial barrier wall is manufactured by using the second source-drain metal layer, and the second source-drain metal layer includes two stacked metal layers, the method for manufacturing the display substrate includes the following steps: as shown in FIG. 4D, after an active layer 4068, a first gate metal layer 4069, a gate insulating layer 4063, a second gate metal layer 4070, an interlayer insulating layer 4064, a first source-drain metal layer pattern 4071, a passivation layer 4065, a first planarization layer 4066, and a second source-drain metal layer are sequentially formed on a base substrate 4061, patterning the second source-drain metal layer to form a second source-drain metal layer pattern 4072 located in the display area and an initial barrier wall 4073 located in the barrier wall disposing area, wherein the initial barrier wall 4073 includes the first initial metal pattern 401 and the second metal pattern 402; as shown in FIG. 4D, forming a second planarization layer 4067 covering the second source-drain metal layer pattern 4072 and the initial barrier wall 4073, and using the second planarization layer 4067 as a protective layer protecting the initial barrier wall 4073; as shown in FIG. 4E, forming an anode material layer on the second planarization layer 4067, coating a photoresist on the anode material layer, and exposing the photoresist by using a mask; after development, forming a photoresist reservation area and a photoresist removal area, wherein the photoresist reservation area corresponds to an area in which a pattern of an anode is located, and the photoresist removal area corresponds to another area outside the pattern of the anode; and etching away, by using an anode etchant, the anode material layer that is not covered by the photoresist, and then peeling off a remaining photoresist, to form the pattern of the anode 4062. In a process of performing etching by using the anode etchant, because the second planarization layer 4067 covers the initial barrier wall 4073, the anode etchant does not come into contact with the initial barrier wall 4073, which prevents formation of a conductive metal particle on the display substrate due to occurrence of a replacement reaction of metal ions in the anode etchant; and as shown in FIG. 4F, after the anode 4062 is formed, a pixel defining layer material layer may be deposited on the base substrate, and the pixel defining layer material layer may be patterned to form the pixel defining layer 4074.

A photoresist is coated on the display substrate on which the pixel defining layer 4074 is formed, and the photoresist is exposed by using a mask. The mask includes a translucent area and a non-translucent area. Orthogonal projections of the hole area and the barrier wall disposing area on the base substrate of the display substrate fall within an orthogonal projection of the translucent area on the base substrate. After development, a photoresist reservation area and a photoresist removal area are formed. The photoresist reservation area corresponds to the display area, the photoresist removal area corresponds to the hole area and the barrier wall disposing area, and the initial barrier wall is exposed. The second planarization layer covering the initial barrier wall is etched, and the second planarization layer covering the initial barrier wall is removed. When the second planarization layer above the initial barrier wall is etched, the display area is not damaged due to protection from the photoresist.

Figure 4G:
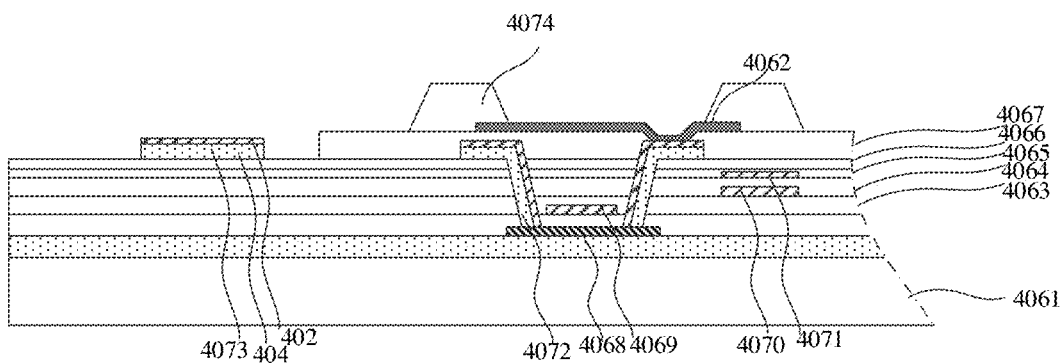
Figure 4H:
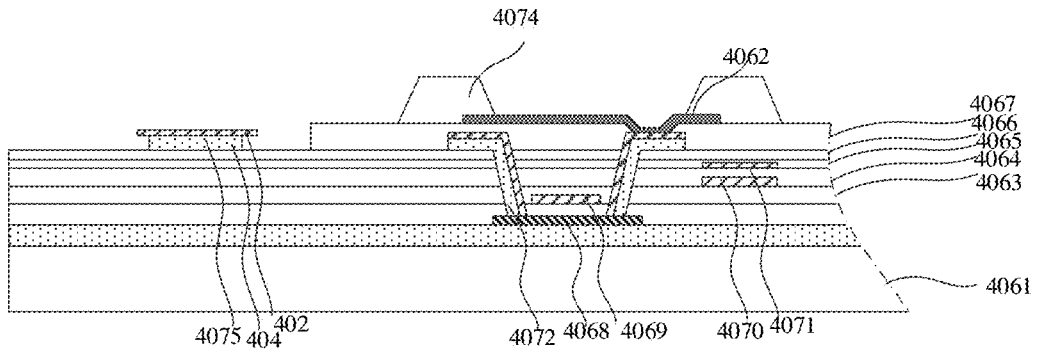

After the second planarization layer 4067 covering the initial barrier wall 4073 is removed, as shown in FIG. 4G, the initial barrier wall 4073 is exposed, and the initial barrier wall 4073 is etched by using an etchant, as shown in FIG. 4H, to form the barrier wall 4075 with a notch on a side surface. The barrier wall 4075 includes the first metal pattern 404 and the second metal pattern 402. When the second source-drain metal layer uses an Al/Ti stacked structure, the initial barrier wall 4073 may be etched by using an Al etchant. The Al etchant etches away some Al in the initial barrier wall 4073, and has no etching effect on Ti, so as to form the barrier wall 4075 with the notch on the side surface.

In another specific example, when the initial barrier wall is manufactured by using the second source-drain metal layer, and the second source-drain metal layer includes three stacked metal layers, the method for manufacturing the display substrate includes the following steps.

Figure 5D:
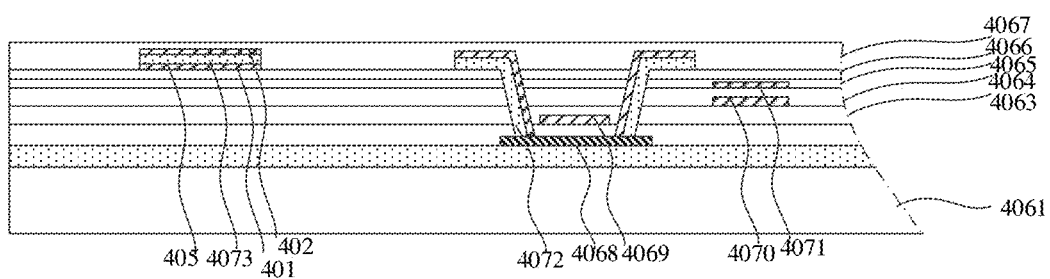
FIG. 5D to FIG. 5H are schematic flowcharts of manufacturing a display substrate provided by an embodiment of the present disclosure.

As shown in FIG. 5D, after an active layer 4068, a first gate metal layer 4069, a gate insulating layer 4063, a second gate metal layer 4070, an interlayer insulating layer 4064, a first source-drain metal layer 4071, a passivation layer 4065, a first planarization layer 4066, and a second source-drain metal layer are sequentially formed on a base substrate 4061, patterning the second source-drain metal layer 4072 to form a second source-drain metal layer pattern 4072 located in the display area and an initial barrier wall 4073 located in the barrier wall disposing area, wherein the initial barrier wall 4073 includes the first initial metal pattern 401, the second metal pattern 402, and a third metal pattern 405.

As shown in FIG. 5D, forming a second planarization layer 4067 covering the second source-drain metal layer pattern 4072 and the initial barrier wall 4073, and using the second planarization layer 4067 as a protective layer for protecting the initial barrier wall 4073.

Figure 5E:
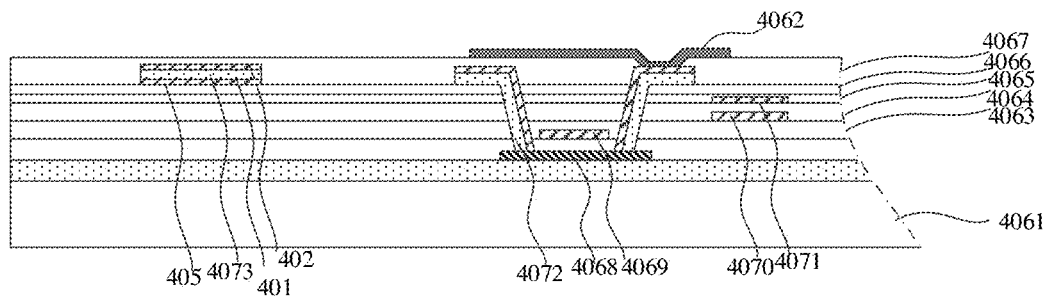

As shown in FIG. 5E, forming an anode material layer on the second planarization layer 4067, coating a photoresist on the anode material layer, and exposing the photoresist by using a mask; after development, forming a photoresist reservation area and a photoresist removal area, wherein the photoresist reservation area corresponds to an area in which a pattern of an anode is located, and the photoresist removal area corresponds to another area outside the pattern of the anode; and etching away, by using an anode etchant, the anode material layer that is not covered by the photoresist, and then peeling off a remaining photoresist, to form the pattern of the anode 4062. In a process of performing etching by using the anode etchant, because the second planarization layer 4067 covers the initial barrier wall 4073, the anode etchant does not come into contact with the initial barrier wall 4073, which prevents formation of a conductive metal particle on the display substrate due to occurrence of a replacement reaction of metal ions in the anode etchant.

Figure 5F:
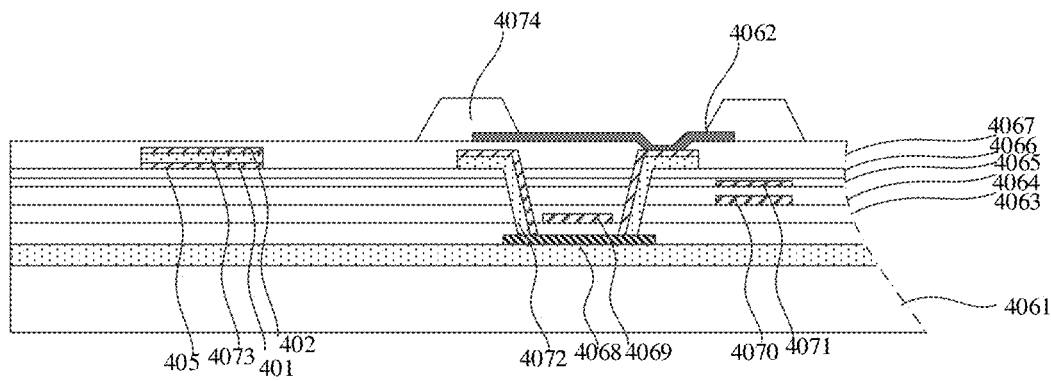

As shown in FIG. 5F, after the anode 4062 is formed, a pixel defining layer material layer may be deposited on the base substrate, and the pixel defining layer material layer may be patterned to form the pixel defining layer 4074.

A photoresist is coated on the display substrate on which the pixel defining layer 4074 is formed, and the photoresist is exposed by using a mask. The mask includes a translucent area and a non-translucent area. Orthogonal projections of the hole area and the barrier wall disposing area on the base substrate of the display substrate fall within an orthogonal projection of the translucent area on the base substrate. After development, a photoresist reservation area and a photoresist removal area are formed. The photoresist reservation area corresponds to the display area, photoresist removal area corresponds to the hole area and the barrier wall disposing area, and the initial barrier wall is exposed. The second planarization layer covering the initial barrier wall is etched, and the second planarization layer covering the initial barrier wall is removed. When the second planarization layer above the initial barrier wall is etched, the display area is not damaged due to protection from the photoresist.

Figure 5G:
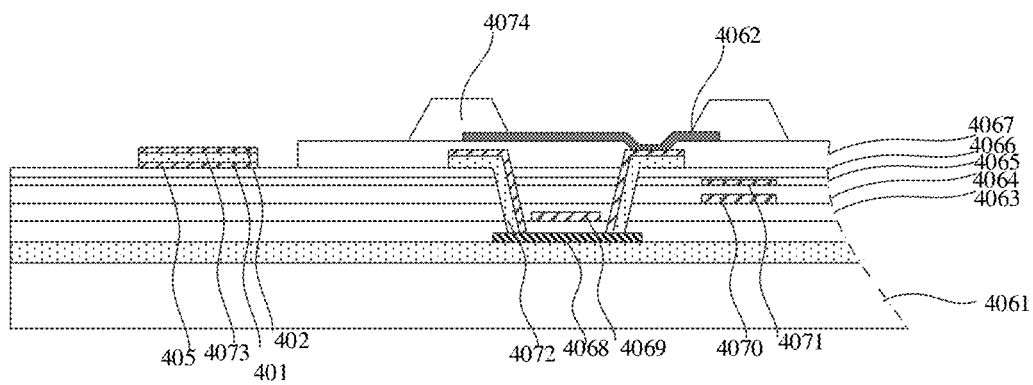
Figure 5H:
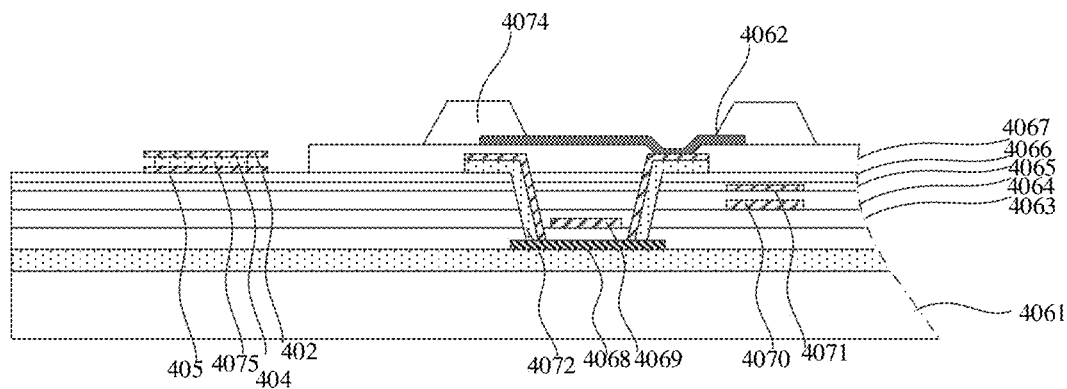

After the second planarization layer 4067 covering the initial barrier wall 4073 is removed, as shown in FIG. 5G, the initial barrier wall 4073 is exposed, and the initial barrier wall 4073 is etched by using an etchant. As shown in FIG. 5H, the barrier wall 4075 with a notch on a side surface is formed, and the barrier wall 4075 includes the first metal pattern 404, the third metal pattern 405, and the second metal pattern 402. When the second source-drain metal layer uses a Ti/Al/Ti stacked structure, the initial barrier wall 4073 may be etched by using an Al etchant. The Al etchant etches away some Al in the initial barrier wall 4073, and has no etching effect on Ti, so as to form the barrier wall 4075 with the notch on the side surface.

Figure 4I:
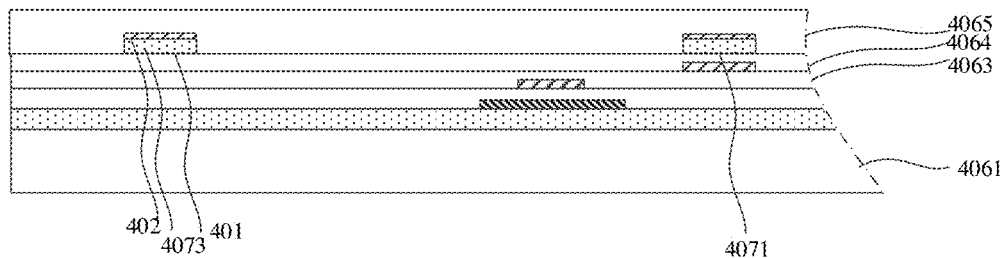
FIG. 4I to FIG. 4O are schematic flowcharts of manufacturing a display substrate according to another embodiment of the present disclosure.
Figure 4J:
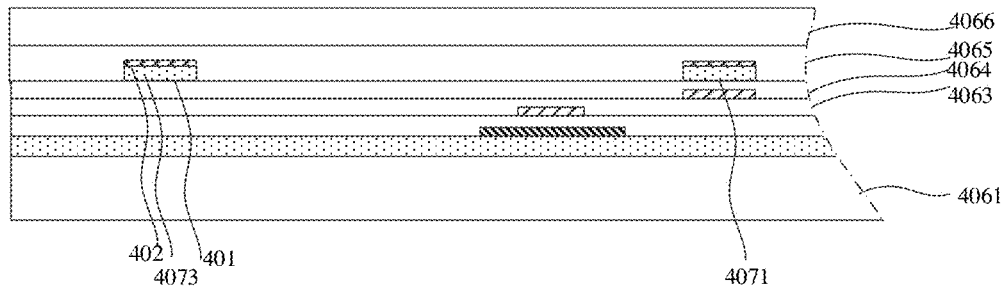
Figure 4K:
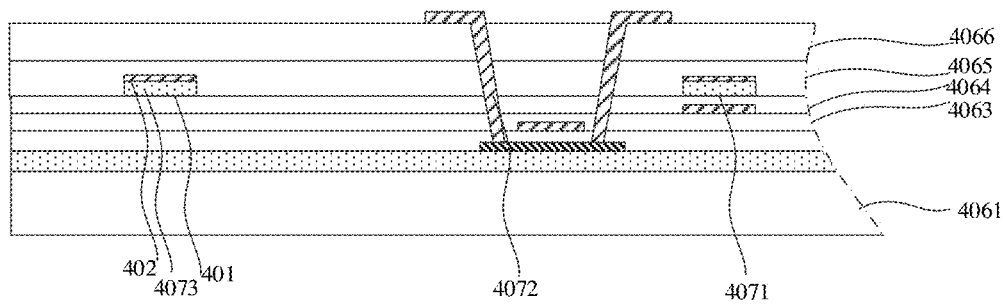
Figure 4L:
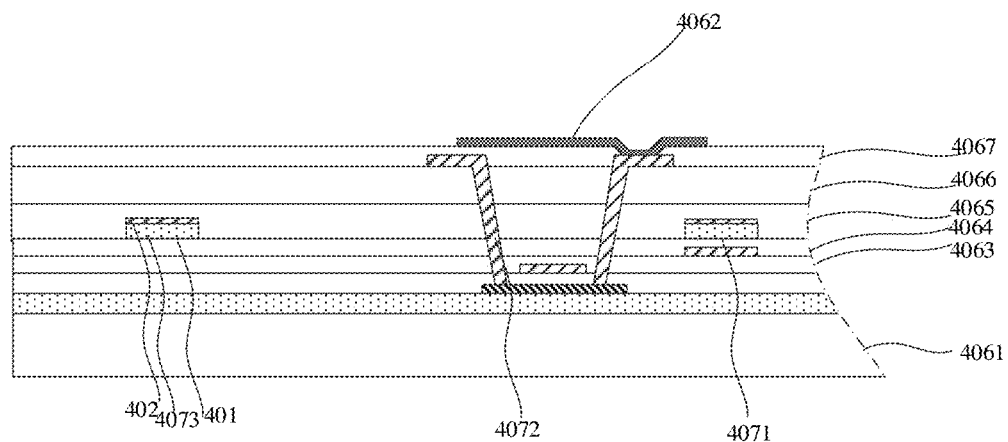

In another specific example, when the initial barrier wall is manufactured by using the first source-drain metal layer, and the first source-drain metal layer includes two stacked metal layers, the method for manufacturing the display substrate includes the following steps:

as shown in FIG. 4I, after the first source-drain metal layer is formed on the base substrate 4061, patterning the first source-drain metal layer to form the first source-drain metal layer pattern 4071 located in the display area and the initial barrier wall 4073 located in the barrier wall disposing area, wherein the initial barrier wall 4073 includes the first initial metal pattern 401 and the second metal pattern 402;

as shown in FIG. 4I, forming the passivation layer 4065 covering the first source-drain metal layer pattern 4071 and the initial barrier wall 4073;

as shown in FIG. 4J, forming the first planarization layer 4066;

as shown in FIG. 4K, forming the second source-drain metal layer pattern 4072 on the first planarization layer 4066;

as shown in FIG. 4L, forming a second planarization layer 4067; and as shown in FIG. 4L, forming an anode material layer on the second planarization layer 4067, coating a photoresist on the anode material layer, and exposing the photoresist by using a mask; after development, forming a photoresist reservation area and a photoresist removal area, wherein the photoresist reservation area corresponds to an area in which a pattern of an anode is located, and the photoresist removal area corresponds to another area outside the pattern of the anode; and etching away, by using an anode etchant, the anode material layer that is not covered by the photoresist, and then peeling off a remaining photoresist, to form the pattern of the anode 4062. In a process of performing etching by using the anode etchant, because the passivation layer 4065, the first planarization layer 4066, and the second planarization layer 4067 serve as the protective layer to cover the initial barrier wall, the anode etchant does not come into contact with the initial barrier wall 4073, which prevents formation of a conductive metal particle on the display substrate due to occurrence of a replacement reaction of metal ions in the anode etchant.

Figure 4M:
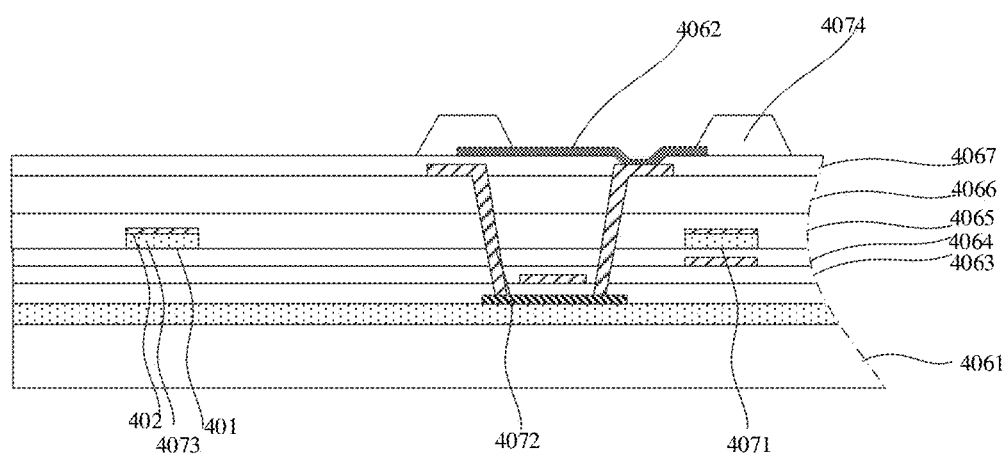

As shown in FIG. 4M, after the anode 4062 is formed, a pixel defining layer material layer may be deposited on the base substrate, and the pixel defining layer material layer may be patterned to form the pixel defining layer 4074.

Figure 4N:
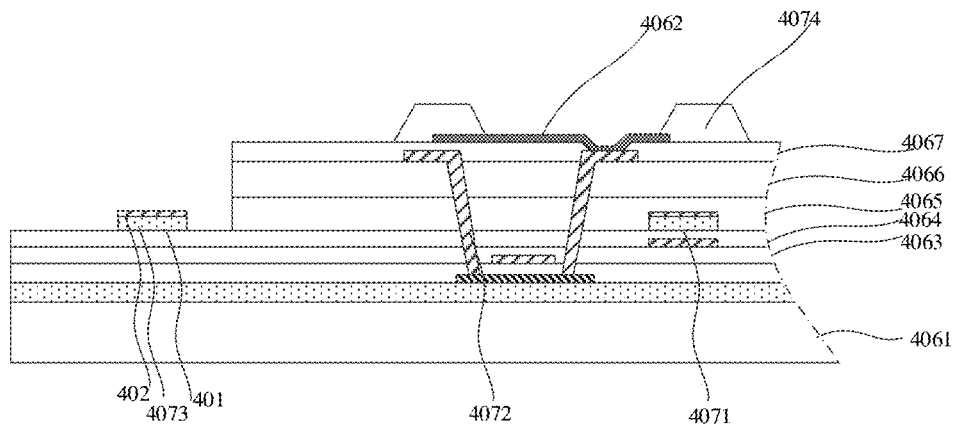

As shown in FIG. 4N, a photoresist is coated on the display substrate on which the pixel defining layer 4074 is formed, and the photoresist is exposed by using a mask. The mask includes a translucent area and a non-translucent area. Orthogonal projection the hole area and the barrier wall disposing area on the base substrate fall within an orthogonal projection of the translucent area on the base substrate. After development, a photoresist reservation area and a photoresist removal area are formed. The photoresist reservation area corresponds to the display area, and the photoresist removal area corresponds to the hole area and the barrier wall disposing area. The passivation layer 4065, the first planarization layer 4066, and the second planarization layer 4067 that cover the initial barrier wall 4073 are etched, and the passivation layer 4065, the first planarization layer 4066, and the second planarization layer 4067 that cover the initial barrier wall 4073 are removed. When the passivation layer 4065, the first planarization layer 4066, and the second planarization layer 4067 that are above the initial barrier wall 4073 are etched, the display area is not damaged due to protection of the photoresist.

Figure 4O:
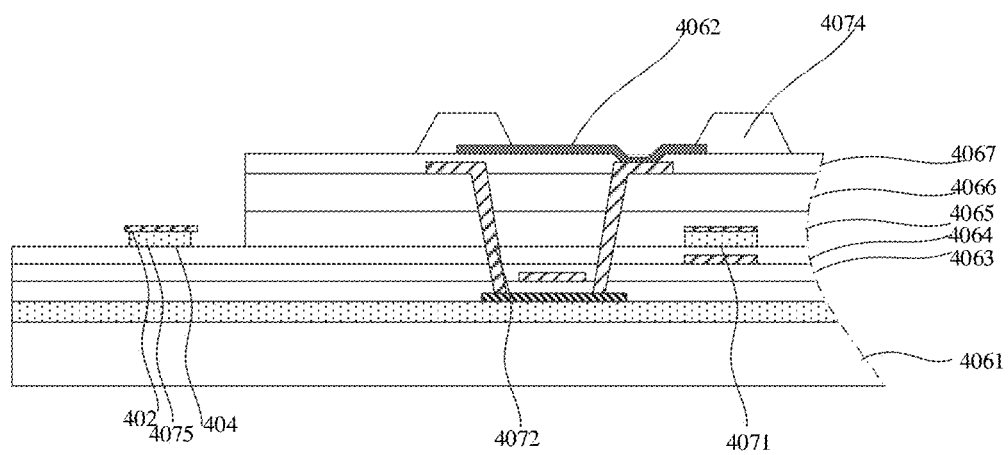

As shown in FIG. 4O, after the passivation layer 4065, the first planarization layer 4066, and the second planarization layer 4067 that cover the initial barrier wall 4073 are removed, the initial barrier wall 4073 is exposed, and the initial barrier wall 4073 is etched by using an etchant, to form the barrier wall 4075 with a notch on a side surface. The barrier wall 4075 includes the first metal pattern 404 and the second metal pattern 402. When the first source-drain metal layer uses an Al/Ti stacked structure, the initial barrier wall 4073 may be etched by using an Al etchant. The Al etchant etches away some Al in the initial barrier wall, and has no etching effect on Ti, so as to form the barrier wall 4075 with the notch on the side surface.

Figure 5I:
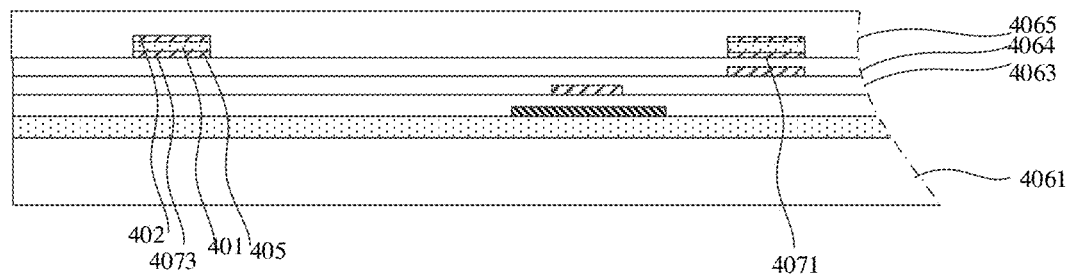
FIG. 5I to FIG. 5O are schematic flowcharts of manufacturing a display substrate according to another embodiment of the present disclosure.
Figure 5J:
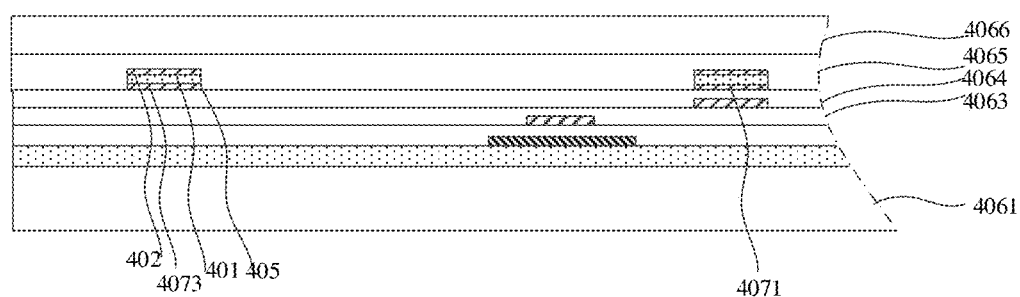
Figure 5K:
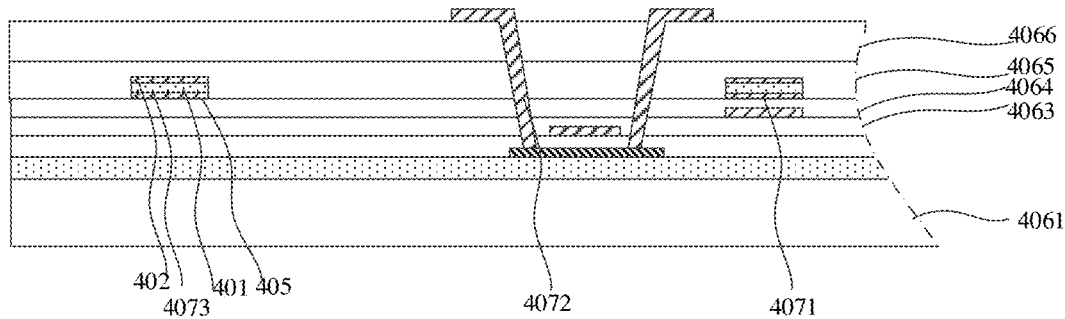
Figure 5L:
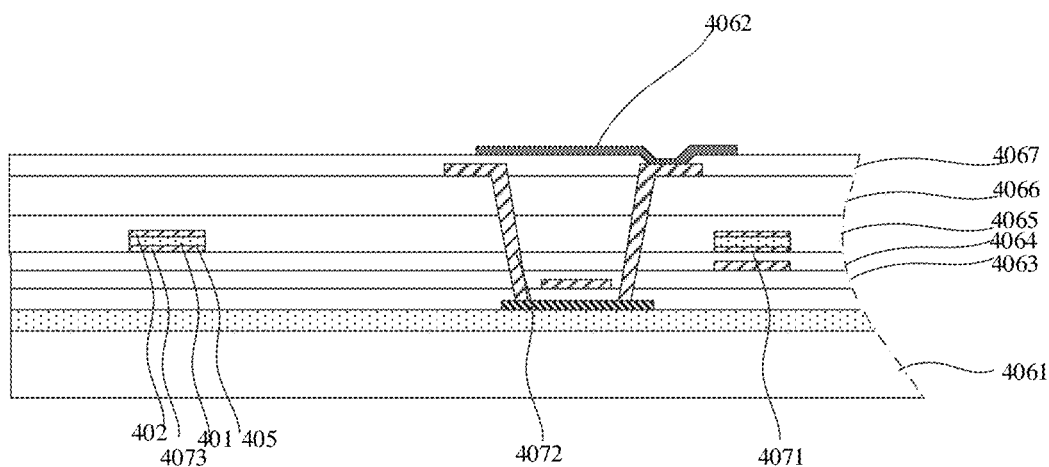

In another specific example, when the initial barrier wall is manufactured by using the first source-drain metal layer, and the first source-drain metal layer includes three stacked metal layers, the method for manufacturing the display substrate includes the following steps:

as shown in FIG. 5I, after the first source-drain metal layer is formed on the base substrate 4061, patterning the first source-drain metal layer to form the first source-drain metal layer pattern 4071 located in the display area and the initial barrier wall 4073 located in the barrier wall disposing area, wherein the initial barrier wall 4073 includes the first initial metal pattern 401, the second metal pattern 402, and the third metal pattern 405;

as shown in FIG. 5I, forming the passivation layer 4065 covering the first source-drain metal layer pattern 4071 and the initial barrier wall 4073;

as shown in FIG. 5J, forming the first planarization layer 4066;

as shown in FIG. 5K, forming the second source-drain metal layer pattern 4072 on the first planarization layer 4066;

as shown in FIG. 5L, forming a second planarization layer 4067; and as shown in FIG. 5L, forming an anode material layer on the second planarization layer 4067, coating a photoresist on the anode material layer, and exposing the photoresist by using a mask; after development, forming a photoresist reservation area and a photoresist removal area, wherein the photoresist reservation area corresponds to an area in which a pattern of an anode is located, and the photoresist removal area corresponds to another area outside the pattern of the anode; and etching away, by using the anode etchant, the anode material layer that is not covered by the photoresist, and then peeling off a remaining photoresist, to form the pattern of the anode 4062. In a process of performing etching by using the anode etchant, because the passivation layer 4065, the first planarization layer 4066, and the second planarization layer 4067 serve as the protective layer to cover the initial barrier wall, the anode etchant does not come into contact with the initial barrier wall 4073, which prevents formation of a conductive metal particle on the display substrate due to occurrence of a replacement reaction of metal ions in the anode etchant.

Figure 5M:
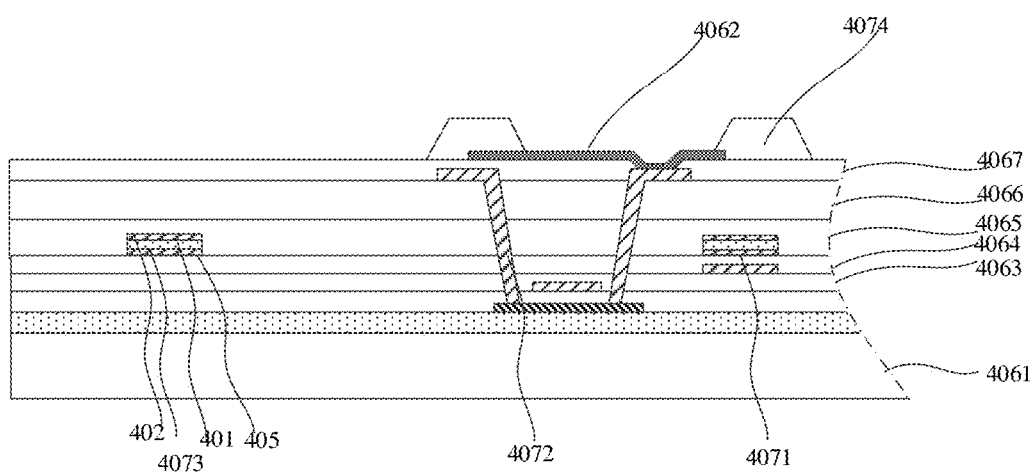

As shown in FIG. 5M, after the anode 4062 is formed, a pixel defining layer material layer may be deposited on the base substrate, and the pixel defining layer material layer may be patterned to form the pixel defining layer 4074.

Figure 5N:
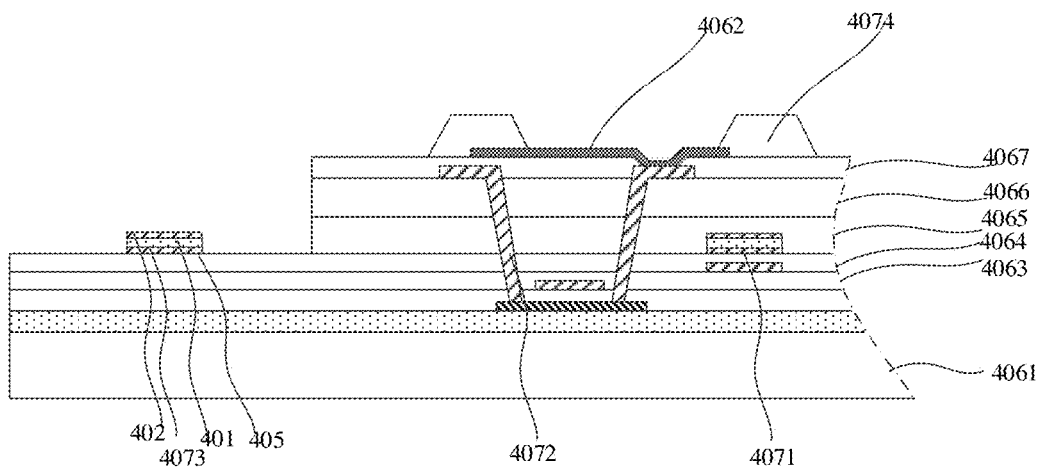

As shown in FIG. 5N, a photoresist is coated on the display substrate on which the pixel defining layer 4074 is formed, and the photoresist is exposed by using a mask. The mask includes a translucent area and a non-translucent area. Orthogonal projections the hole area and the barrier wall disposing area on the base substrate fall within an orthogonal projection of the translucent area on the base substrate. After development, a photoresist reservation area and a photoresist removal area are formed. The photoresist reservation area corresponds to the display area, and the photoresist removal area corresponds to the hole area and the barrier wall disposing area. The passivation layer 4065, the first planarization layer 4066, and the second planarization layer 4067 that cover the initial barrier wall 4073 are etched, and the passivation layer 4065, the first planarization layer 4066, and the second planarization layer 4067 that cover the initial barrier wall 4073 are removed. When the passivation layer 4065, the first planarization layer 4066, and the second planarization layer 4067 that are above the initial barrier wall 4073 are etched, the display area is not damaged due to protection of the photoresist.

Figure 5O:
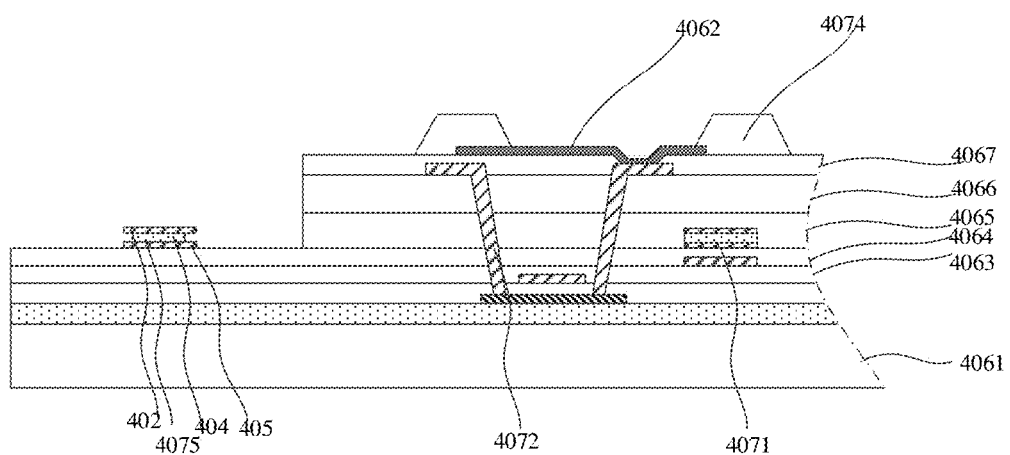

As shown in FIG. 5O, after the passivation layer 4065, the first planarization layer 4066, and the second planarization layer 4067 that cover the initial barrier wall 4073 are removed, the initial barrier wall 4073 is exposed, and the initial barrier wall 4073 is etched by using an etchant, to form the barrier wall 4075 with a notch on a side surface. The barrier wall 4075 includes the first metal pattern 404, the third metal pattern 405, and the second metal pattern 402. When the first source-drain metal layer uses a Ti/Al/Ti stacked structure, the initial barrier wall 4073 may be etched by using an Al etchant. The Al etchant etches away some Al in the initial barrier wall 4073, and has no etching effect on Ti, so as to form the barrier wall 4075 with the notch on the side surface.

In another specific embodiment, the display substrate includes an active layer, a first gate metal layer, a gate insulating layer, a second gate metal layer, an interlayer insulating layer, a source-drain metal layer, a passivation layer, a planarization layer, an anode, and a pixel defining layer that are sequentially disposed on the first side of the base substrate. To simplify the manufacturing process and the structure of the display substrate, the initial barrier wall may be manufactured by using the first gate metal layer, the second gate metal layer, or the source-drain metal layer.

In a specific example, when the initial barrier wall is manufactured by using the source-drain metal layer, the method for manufacturing the display substrate includes the following steps: after the source-drain metal layer is formed on the base substrate, patterning the source-drain metal layer to form a source-drain metal layer pattern located in the display area and an initial barrier wall located in the barrier wall disposing area; forming a passivation layer covering the source-drain metal layer pattern and the initial barrier wall; forming the planarization layer; and forming an anode material layer on the planarization layer, coating a photoresist on the anode material layer, and exposing the photoresist by using a mask; after development, forming a photoresist reservation area and a photoresist removal area, wherein the photoresist reservation area corresponds to an area in which a pattern of an anode is located, and the photoresist removal area corresponds to another area outside the pattern of the anode; and etching away, by using an anode etchant, the anode material layer that is not covered by the photoresist, and then peeling off a remaining photoresist, to form the pattern of the anode. In a process of performing etching by using the anode etchant, because the passivation layer and the planarization layer cover the initial barrier wall, the anode etchant does not come into contact with the initial barrier wall, which prevents formation of a conductive metal particle on the display substrate due to occurrence of a replacement reaction of metal ions in the anode etchant.

After the anode is formed, a pixel defining layer material layer may be deposited on the base substrate, and the pixel defining layer material layer may be patterned to form the pixel defining layer.

A photoresist is coated on the display substrate on which the pixel defining layer is formed, and the photoresist is exposed by using a mask. The mask includes a translucent area and a non-translucent area. Orthogonal projections the hole area and the barrier wall disposing area on the base substrate fall within an orthogonal projection of the translucent area on the base substrate. After development, a photoresist reservation area and a photoresist removal area are formed. The photoresist reservation area corresponds to the display area, photoresist removal area corresponds to the hole area and the barrier wall disposing area, and the initial barrier wall is exposed. The passivation layer and the planarization layer that cover the initial barrier wall are etched, and the passivation layer and the planarization layer that cover the initial barrier wall are removed. When the passivation layer and the planarization layer above the initial barrier wall are etched, the display area is not damaged due to protection from the photoresist.

After passivation layer and the planarization layer that cover the initial barrier wall are removed, the initial barrier wall is exposed, and the initial barrier wall is etched by using an etchant, to form the barrier wall with a notch on a side surface. When the source-drain metal layer uses a Ti/Al/Ti stacked structure, the initial barrier wall may be etched by using an Al etchant. The Al etchant etches away some Al in the initial barrier wall, and has no etching effect on Ti, so as to form the barrier wall with the notch on the side surface.

An embodiment of the present disclosure further provides a display substrate, obtained by using the manufacturing method described above, wherein the display substrate includes a display area, a barrier wall disposing area, and a hole area, the display area surrounds the barrier wall disposing area, the barrier wall disposing area surrounds the hole area, at least one circle of a barrier wall surrounding the hole area is disposed in the barrier wall disposing area, and a notch is formed on at least one side surface of the barrier wall.

Figure 6A:
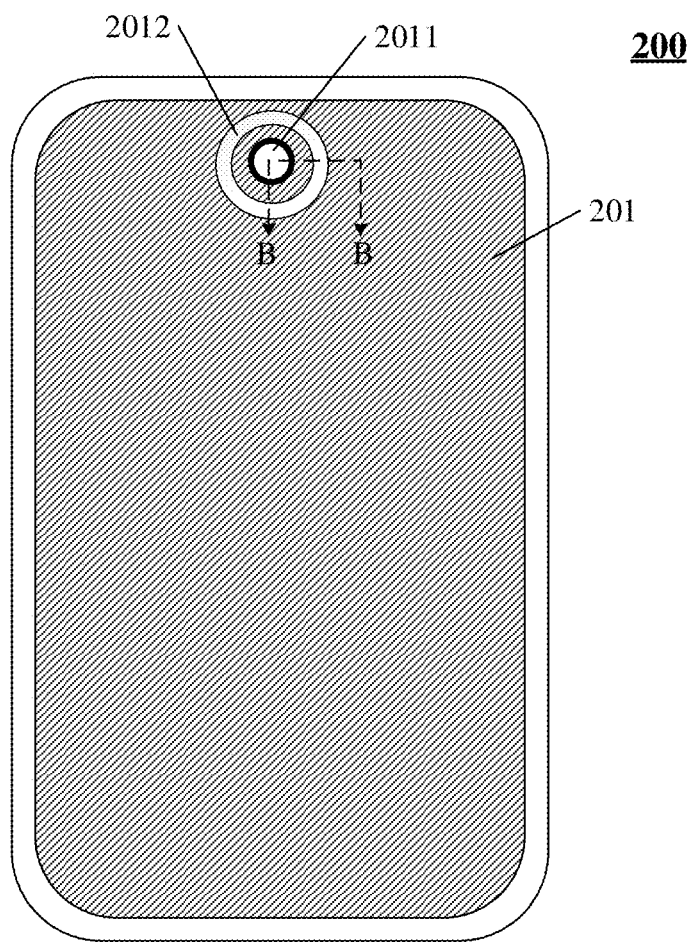
FIG. 6A is a schematic plan view of a display substrate provided by an embodiment of the present disclosure.
Figure 6B:
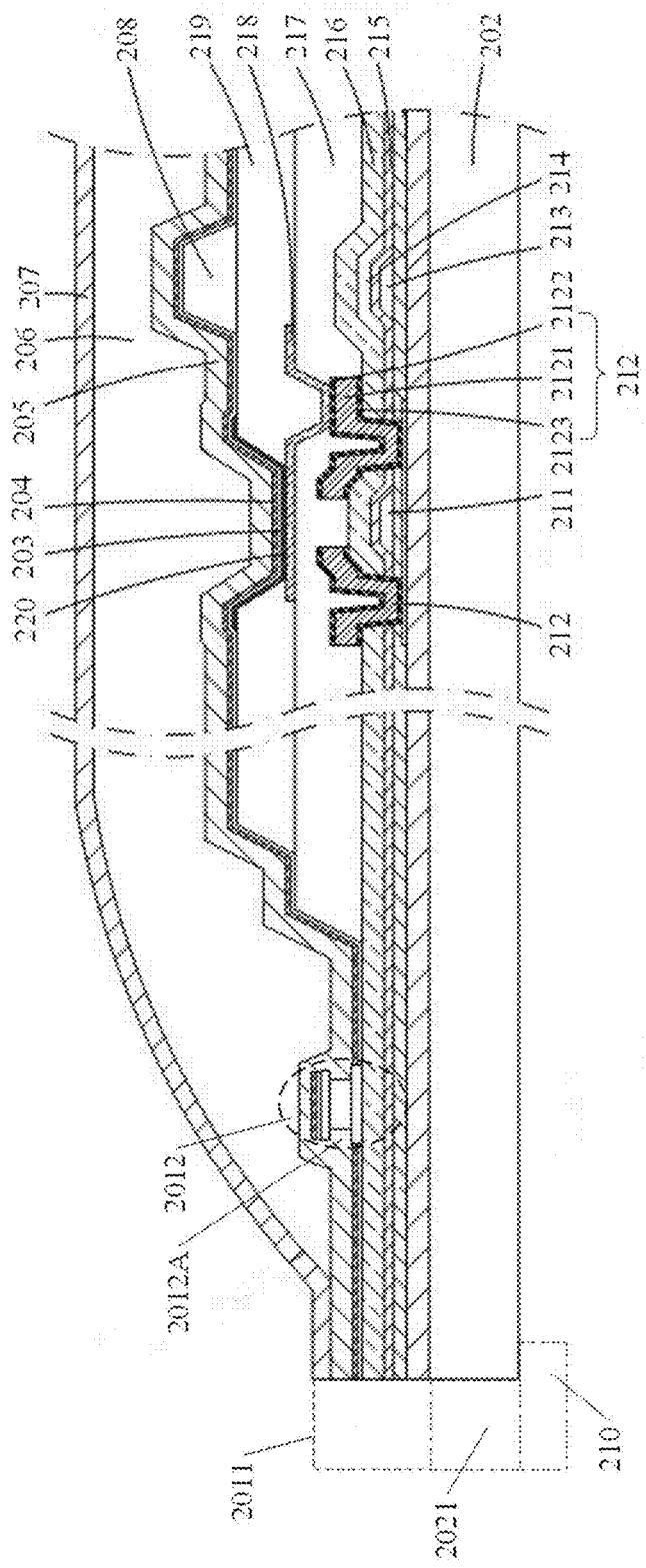
FIG. 6B is a schematic sectional view of the display substrate in FIG. 6A along a line B-B.

In a specific embodiment, a schematic plan view of the display substrate is shown in FIG. 6A, and FIG. 6B is a schematic sectional view of the display substrate in FIG. 6A along a line B-B.

As shown in FIG. 6A and FIG. 6B, a display substrate 200 includes a display area 201 and a hole area 2011, the display area 201 surrounds the hole area 2011, and a barrier wall disposing area is provided between the display area 201 and the hole area 2011, a first barrier wall 2012 is disposed in the barrier wall disposing area, and the first barrier wall 2012 surrounds the hole area 2011. The first barrier wall 2012 includes a first metal layer structure, and at least one side surface, surrounding the hole area 2011, of the first metal layer structure is provided with a notch 2012A. The hole area 2011 allows light from a display side (an upper side in FIG. 6B) of the display substrate to pass through the display substrate, to reach a back side of the display substrate (a lower side in FIG. 6B)

In a specific example, in the first metal layer structure shown in FIG. 6B, each of a side surface, facing the hole area 2011, of the first metal layer structure and a side surface facing away from the hole area 2011 is provided with a notch 2012A; or in another example in this embodiment, one side surface of the first metal layer structure may be provided with a notch 2012A.

In this embodiment, the display area 201 includes a pixel array used for display operations. The pixel array includes a plurality of pixel units arranged in an array, and the pixel units include a drive circuit, a light emitting circuit, and the like. Therefore, the display area 201 further includes an electrode pattern, and the electrode pattern includes a second metal layer structure. The first metal layer structure and the second metal layer structure have a same structure and use a same material. For example, the first metal layer structure and the second metal layer structure can be formed at a same layer and have a same multilayer structure in a manufacturing process. In the first metal layer structure and the second metal multilayer structure, materials of corresponding layers are the same. Therefore, the first metal layer structure and the second metal layer structure can be formed by using a same film layer.

In a specific example, as shown in FIG. 6B, the display area 201 includes a pixel array, and a plurality of pixel units of the pixel array include a plurality of light emitting devices used for display and a drive circuit for driving the light emitting devices. The light emitting device may include a structure such as an electrode layer or an organic function layer, and the drive circuit may include a structure such as a thin film transistor or a capacitor.

As shown in FIG. 6B, the light emitting device includes a first electrode layer 218, a second electrode layer 204, and an organic function layer between the first electrode layer 218 and the second electrode layer 204. The organic function layer includes, for example, an organic light emitting material layer 220 and an auxiliary light emitting layer 203. The auxiliary light emitting layer 203 is, for example, an electron transport layer or an electron injection layer. At least a part of the organic function layer of the light emitting device used for the plurality of pixel units, such as the auxiliary light emitting layer 203 and the second electrode layer 204, is usually formed as an entire surface in the display area 201. In this case, the organic function layer is disconnected on the side surface, on which the notch 2012A is provided, of the first barrier wall 2012. The first electrode layer 218 may be an anode layer, the second electrode layer 204 may be a cathode layer, and the cathode layer is also disconnected on the side surface, on which the notch 1012A is provided, of the first barrier wall 2012. In this way, when the organic function layer and the second electrode layer 204 located on a side proximal to the hole area 2011 are polluted by impurities such as water and oxygen, the organic function layer and the second electrode layer 204 are separated by the first barrier wall 2012, so that these pollution impurities do not extend to a part, used by the light emitting device for light emitting, of the organic function layer and the second electrode layer 204. A part of organic function layer and a part of second electrode layer 204 are also formed on a top of the first barrier wall 2012, but these parts are separated from other parts.

As shown in FIG. 6B, a thin film transistor includes a structure such as a gate electrode 211 and a source/drain electrode 212. A capacitor includes a first electrode 213, a second electrode 214, and a first insulating layer 215 between the first electrode 213 and the second electrode 214. The gate electrode 211 or the source/drain electrode 212 may be implemented as an electrode pattern with a second metal layer structure. As shown in FIG. 6B, the source/drain electrode 212 includes the second metal layer structure. In this case, the first metal layer structure of the first barrier wall 2012 and the second metal layer structure of the source/drain electrode 212 may have a same structure and use a same material. For example, the first metal layer structure of the first barrier wall 2012 and the second metal layer structure of the source/drain electrode 212 are formed at a same layer and have a same multilayer structure, so that in a process of manufacturing the display substrate 200, the first metal layer structure of the first barrier wall 2012 and the second metal layer structure of the source/drain electrode 212 may be formed by using a same film layer. For example, in some examples, both the first metal layer structure and the second metal layer structure have the multilayer structure such as a double-layer structure or a triple-layer structure.

As shown in FIG. 6B, the display substrate 200 further includes a base substrate 202, the display area 201 is on the base substrate 202, and the base substrate 202 is provided with a hole 2021 provided in the hole area 2011. An opening direction of the notch in the first metal layer structure of the first barrier wall 2012 may be parallel to the base substrate 202. For example, in the embodiment in FIG. 6B, the base substrate 202 is placed along a horizontal direction, and the opening direction of the notch is the horizontal direction.

Figure 7:
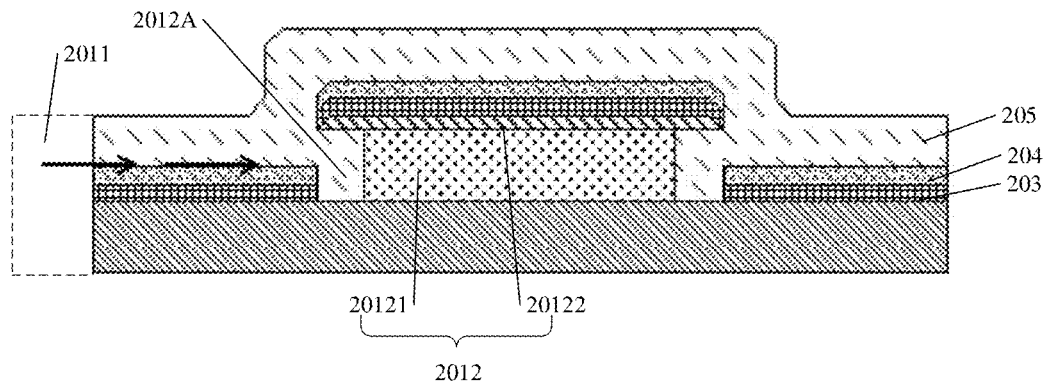
FIG. 7 is a schematic sectional view of a barrier wall in a display substrate provided by an embodiment of the present disclosure.

In an example, as shown in FIG. 7, the first metal layer structure of the first barrier wall 2012 includes two layers of metal patterns, in other words, a first metal pattern 20121 and a second metal pattern 20122. The first metal pattern 20121 is on a first side (a side on which the light emitting device is to be formed and that is shown as an upper side in the figure) of the base substrate 202, and the second metal pattern 20122 is on a side (shown as an upper side in the figure), away from the base substrate 202, of the first metal pattern 20121, an orthogonal projection of the first metal pattern 20121 on the base substrate 202 falls within an orthogonal projection of the second metal pattern 20122 on the base substrate 202. Therefore, the notch 2012A is formed on a side surface on which the first metal pattern 20121 and the second metal pattern 20122 are stacked. In this case, when the organic function layer and the second electrode layer 204 are formed on the base substrate 202 on which the first barrier wall 2012 is formed, the organic function layer and the second electrode layer 204 may be disconnected on the first barrier wall 2012, so as to cut off a route of impurities such as water and oxygen entering the display area 201.

Figure 8:
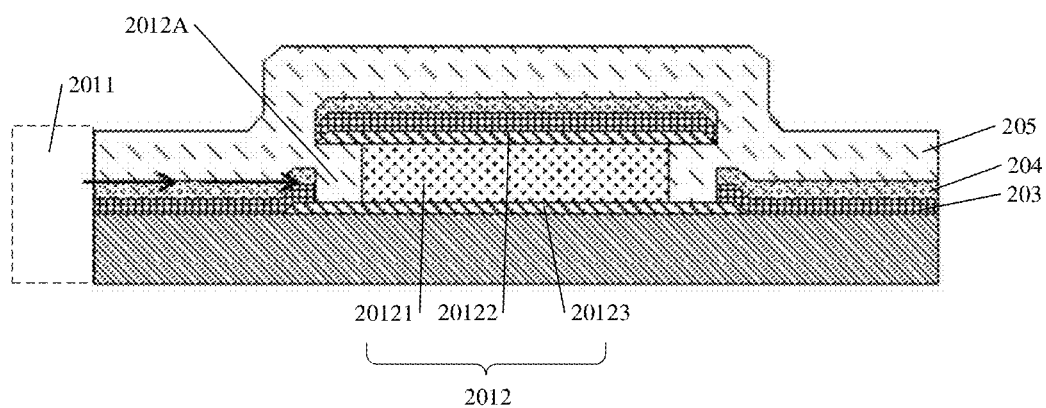
FIG. 8 is a schematic sectional view of a barrier wall in a display substrate provided by an embodiment of the present disclosure.

In another example, as shown in FIG. 8, the first metal layer structure of the first barrier wall 2012 includes three layers of metal layer structures, namely the first metal pattern 20121, the second metal pattern 20122, and a third metal pattern 20123. The third metal pattern 20123 is on the first side (shown as an upper side in the figure) of the base substrate 202, the first metal pattern 20121 is on a side (shown as an upper side in the figure), away from the base substrate 202, of the third metal pattern 20123, and the second metal pattern 20122 is on a side (shown as an upper side in the figure), away from the base substrate 202, of the first metal pattern 20121. An orthogonal projection of the first metal pattern 20121 on the base substrate 202 falls within an orthogonal projection of the second metal pattern 20122 on the base substrate 202, and the orthogonal projection of the first metal pattern 20121 on the base substrate 202 further falls within an orthogonal projection of the third metal pattern 20123 on the base substrate 202. Therefore, the notch 2012A is formed on a side surface on which the first metal pattern 20121, the second metal pattern 20122, and third metal pattern 20123 are stacked. In this case, when the organic function layer and the second electrode layer 204 are formed on the base substrate 202 on which the first barrier wall 2012 is formed, the organic function layer and the second electrode layer 204 may be disconnected on the first barrier wall 2012, so as to cut off a route of impurities such as water and oxygen entering the display area 201.

In some examples, the orthogonal projection of the second metal pattern 20122 on the base substrate 202 may fall within the orthogonal projection of the third metal pattern 20123 on the base substrate 202. In this case, the orthogonal projection of the third metal pattern 20123 on the base substrate 202 is the largest. Therefore, bonding strength between the first metal layer structure of the first barrier wall 2012 and the display substrate can be enhanced, and stability of the first metal layer structure can be enhanced, and a disconnection between the organic function layer and the second electrode layer 204 on the first barrier wall 2012 can be facilitated.

FIG. 6B shows an example of the three layers of metal layer structures. In this case, the second metal layer structure of the source/drain electrode 212 includes a metal sublayer 2123 at a same layer as the third metal pattern 20123, and a metal sublayer 2121 at a same layer as the first metal pattern 20121, and a metal sublayer 2122 at a same layer as the second metal pattern 20122.

As shown in FIG. 6B, the second metal layer structure of the source/drain electrode 212 in the thin film transistor and the first metal layer structure are formed at a same layer and have a same multilayer structure, that is, both have three layers of metal layer structures, so that in a process of manufacturing the display substrate 200, the first metal layer structure of the first barrier wall 2012 and the second metal layer structure of the source/drain electrode 212 may be formed by using a same film layer through one same manufacturing process, to simplify process steps.

In a specific example, in the first metal layer structure of the first barrier wall 2012, a thickness of the first metal pattern 20121 is greater than a thickness of the second metal pattern 20122 and a thickness of the third metal pattern 20123, so that it is easier to form the notch and it is more conducive to disconnect the organic material layer 203 and the second electrode layer 204 on the first barrier wall 2012. Therefore, the first barrier wall 2012 may achieve a better barrier effect. For example, the thickness of the first metal pattern 20121 ranges from 150 nm to 900 nm, such as 200 nm, 400 nm, 600 nm, or 800 nm; the thickness of the second metal pattern 20122 ranges from 30 nm to 300 nm, such as 100 nm, 150 nm, or 200 nm; the thickness of the third metal pattern 20123 ranges from 30 nm to 300, such as 100 nm, 150 nm, or 200 nm. Specifically, the thickness of the first metal pattern 20121 may be 600 nm, the thickness of the second metal pattern 20122 may be 200 nm, and the thickness of the third metal pattern 20123 may be 200 nm. In this case, the first barrier wall 2012 may fully implement a barrier effect.

In some embodiments of the present disclosure, a material of the second metal pattern 20122 and a material of the third metal pattern 20123 may be the same, and a material of the first metal pattern 20121 and the material of the second metal pattern 20122 have different etch rates during etching. For example, under an action of an etchant used for etching to form the first metal layer structure, a rate at which the material of the first metal pattern 20121 is etched is greater than a rate at which the material of the second metal pattern 20122 is etched, so that it is easy to form the first metal layer structure with the notch 2012A during manufacturing.

In some embodiments, the material of the first metal pattern 20121 includes metal such as aluminum or copper or an alloy thereof, the material of the second metal pattern 20122 includes metal such as titanium or molybdenum or an alloy thereof, and the material of the third metal pattern 20123 is similar to that of the second metal pattern 20123, and includes metal such as titanium or molybdenum or an alloy thereof. Under an action of the etchant used for etching to form an electrode structure of the display substrate, such as the second electrode layer 204, a rate at which aluminum or copper is etched is greater than a rate at which titanium or molybdenum is etched. As a result, while the electrode structure such as the second electrode layer 204 is formed through etching, the first metal pattern 20121, the second metal pattern 20122, and the third metal pattern 20123 may be etched, to form the notch 2012A.

In some examples, when the first metal layer structure uses a double-layer structure, a material combination of the first metal pattern 20121 and the second metal pattern 20122 may be aluminum/titanium, aluminum/molybdenum, copper/titanium, copper/molybdenum, or the like. When the first metal layer structure uses a three-layer structure, a material combination of the third metal pattern 20123, the first metal pattern 20121, and the second metal pattern 20122 may be titanium/aluminum/titanium, molybdenum/aluminum/molybdenum, titanium/copper/titanium, molybdenum/copper/molybdenum, or the like.

In some embodiments of the present disclosure, as shown in FIG. 6B, the display substrate 200 further includes an image sensor and/or an infrared sensor. The image sensor and/or the infrared sensor are integrated on the base substrate 202, for example, integrated on a side, away from a light emitting device, of the base substrate 202, and an orthogonal projection on the base substrate 202 at least partially overlaps the hole area 2011. For example, the image sensor and/or the infrared sensor are/is disposed at a position indicated by the reference number 210 in the figure. As a result, the image sensor and/or the infrared sensor may implement a function such as image acquisition, face recognition, or infrared sensing through the hole area 2011.

It should be noted that in some examples in this embodiment, the display substrate 200 may further include a structure such as a second insulating layer 216 covering a capacitor, a planarization layer 217 for planarizing a drive circuit, a pixel defining layer 219 for defining a pixel array, and a columnar spacer 208 for forming packaging space, a packaging layer 205 for sealing, a second packaging layer 206 and a third packaging layer 207 for further improving a packaging effect, which are not repeated in this embodiment of the present disclosure. In an example in this embodiment, because one of the source and drain electrodes 212 of the thin film transistor is connected to the first electrode layer 218, the thin film transistor may be a drive transistor, that is, a value of a light emitting current flowing through the light emitting device is controlled based on an applied data signal, so as to control a gray scale of a pixel unit in a display process.

Figure 6C:
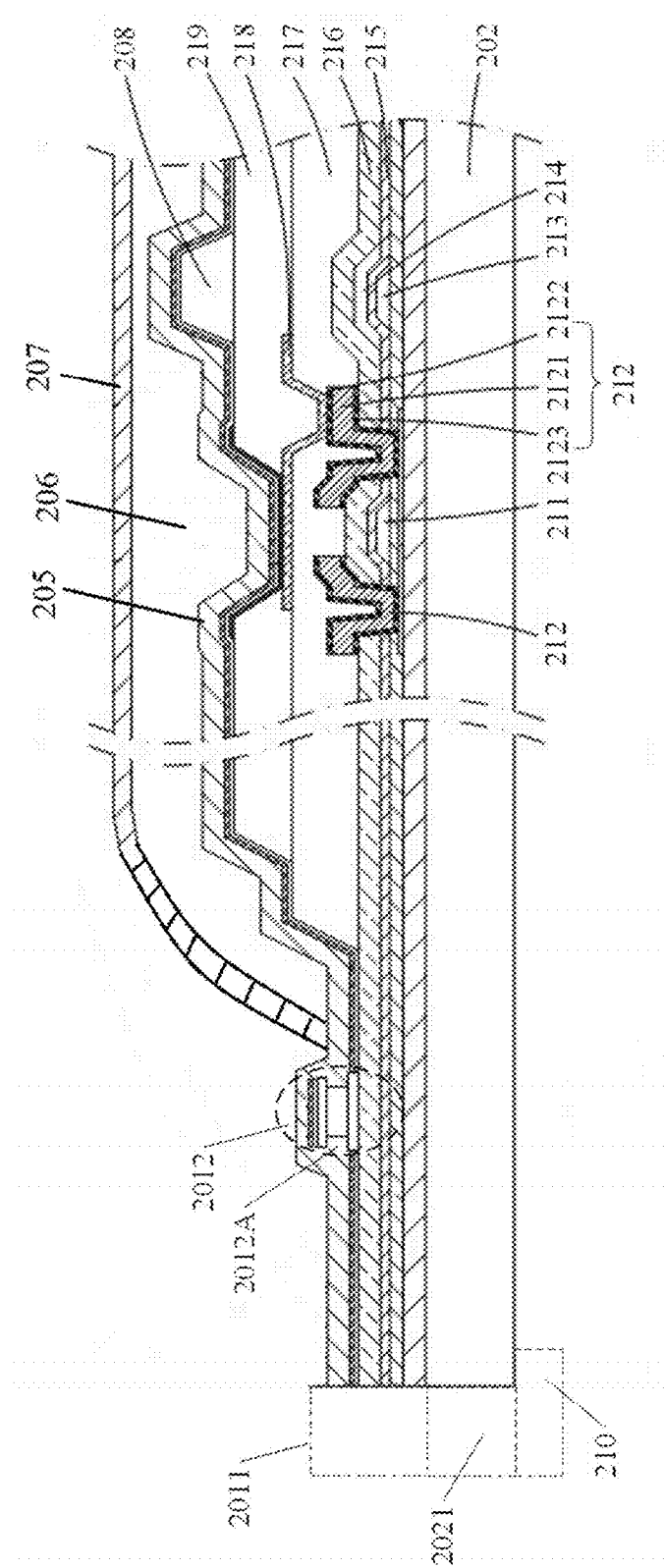
FIG. 6C is another schematic sectional view of the display substrate in FIG. 6A along a line B-B.

The packaging layer 205 is an inorganic packaging layer, including a material such as silicon oxide or silicon nitride. The second packaging layer 206 is an organic packaging layer, including an organic material such as polyimide. The third packaging layer 207 is an inorganic packaging layer, including a material such as silicon oxide or silicon nitride. In an example in FIG. 6B, the packaging layer 205, the second packaging layer 206, and the third packaging layer 207 all extend to a side, proximal to the hole area 2011, of the first barrier wall 2012, so that the three packaging layers are all used to package the first barrier wall 2012. In another example, as shown in FIG. 6C, the packaging layer 205 extends to the side, proximal to the hole area 2011, of the first barrier wall 2012, and the second packaging layer 206 and the third packaging layer 207 both terminate on a side, proximal to the display area 201, the first barrier wall 2012. Because a capability of an organic material to block water and oxygen is relatively weak, the second packaging layer 206 including the organic material terminates at a position farther away from the hole area 201, to prevent impurities such as water and oxygen from entering the display area 201 through the second packaging layer 206. In some examples, the packaging layer 205 and the third packaging layer 207 may also extend to the side, proximal to the hole area 2011, of the first barrier wall 2012, and only the second packaging layer 206 terminates on the side, proximal to the display area 201, of the first barrier wall 2012. In this example, impurities such as water and oxygen may also be prevented from entering the display area 201 through the second packaging layer 206 including the organic material. In this embodiment of the present disclosure, a specific manner of disposing the packaging layer 205, the second packaging layer 206, and the third packaging layer 207 is not limited.

In some embodiments of the present disclosure, for example, more than one layer of barrier wall may be further disposed around the hole area 2011 of a display panel, that is, a plurality of layers of barrier walls may be included, for example, two layers, three layers, four layers, or five layers are disposed to enhance the barrier effect.

Figure 9A:
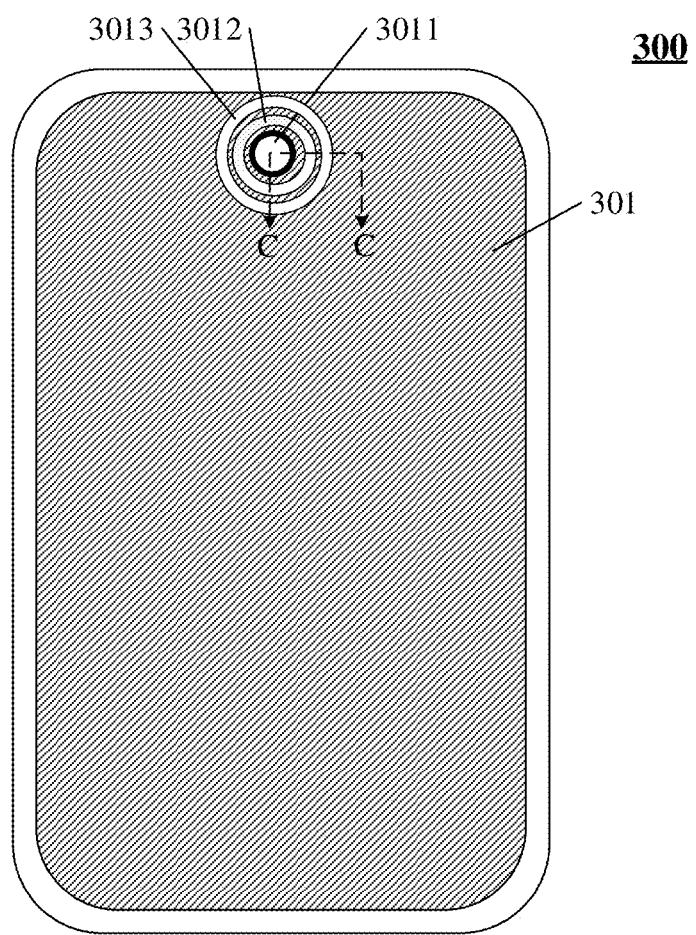
FIG. 9A is a schematic plan view of a display substrate according to another embodiment of the present disclosure.
Figure 9B:
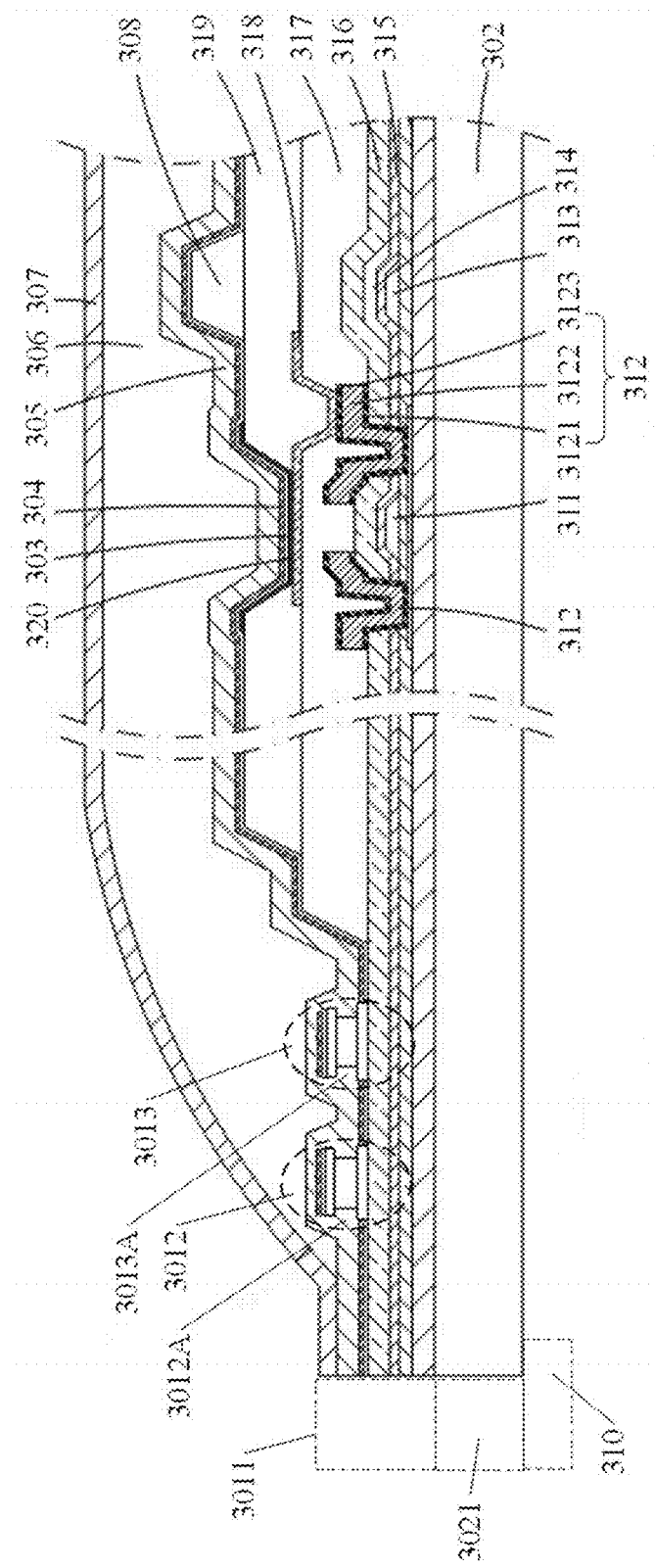
FIG. 9B is a schematic sectional view of the display substrate in FIG. 9A along a line C-C.

The display substrate shown in FIG. 9A and FIG. 9B includes two layers of barrier walls. FIG. 9A is a schematic plan view of the display substrate, and FIG. 9B is a schematic sectional view of the display substrate in FIG. 9A along a line C-C.

As shown in FIG. 9A and FIG. 9B, a display substrate 300 includes a display area 301 and a hole area 3011, the display area 301 surrounds the hole area 3011, a first barrier wall 3012 and a second barrier wall 3013 are included between the display area 301 and the hole area 3011, and the first barrier wall 3012 and the second barrier wall 3013 surround the hole area 3011. The second barrier wall 3013 is disposed on a side, away from the hole area 3011, of the first barrier wall 3012, and is spaced apart by a certain distance. Each of the first barrier wall 3012 and the second barrier wall 3013 includes a first metal layer structure, and at least one side surface, surrounding the hole area 3011, of the first metal layer structure of the first barrier wall 3012 is provided with a notch 3012A, and at least one side surface, surrounding the hole area 3011, of the first metal layer structure of the second barrier wall 3013 is provided with a notch 3013A.

Same as the above embodiment, the display area 301 includes an electrode pattern, and the electrode pattern includes a second metal layer structure. The first metal layer structures of the first barrier wall 3012 and the second barrier wall 3013 and the second metal layer structure have a same structure, and use a same material. For example, the first metal layer structures of the first barrier wall 3012 and the second barrier wall 3013 and the second metal layer structure are formed at a same layer and have a same multilayer structure.

The display area 301 includes a pixel array, and a plurality of pixel units of the pixel array include a plurality of light emitting devices used for display and a drive circuit for driving the light emitting devices. For example, the drive circuit includes a structure such as a thin film transistor or a capacitor.

As shown in FIG. 9B, the light emitting device includes a first electrode layer 318, a second electrode layer 304, and an organic function layer between the first electrode layer 320 and the second electrode layer. The organic function layer includes, for example, an organic light emitting material layer 210 and an auxiliary light emitting layer 303. At least a part of the organic function layer, such as the auxiliary light emitting layer 303 and the second electrode layer 304, is usually formed as an entire surface in the display area 301. In this case, the organic function layer is disconnected on the side surface, on which the notch 3012A/3013A is provided, of the first barrier wall 3012 and the second barrier wall 3013. The first electrode layer 318 may be an anode layer, the second electrode layer 304 may be a cathode layer, and the cathode layer is also disconnected on the side surface, on which the notch 3012A/3013A is provided, of the first barrier wall 2012 and the second barrier wall 3013. In this way, when the organic function layer and the second electrode layer 304 located on a side proximal to the hole area 3011 are polluted by impurities such as water and oxygen, the organic function layer and the second electrode layer 304 are separated by the first barrier wall 3012, so that the pollution does not extend to a part, used by the light emitting device for light emitting, of the organic function layer and the second electrode layer 304. An organic function layer and a second electrode layer 304 are also formed on the first barrier wall 3012, but these parts are separated from other parts.

Similarly, a thin film transistor includes a structure such as a gate electrode 311 and a source/drain electrode 312. A capacitor includes a first electrode 313, a second electrode 314, and a first insulating layer 315 between the first electrode 313 and the second electrode 314. The gate electrode 311 or the source/drain electrode 312 may be implemented as an electrode pattern with a second metal layer structure. As shown in FIG. 9B, the source/drain electrode 312 includes the second metal layer structure, and the first metal layer structures of the first barrier wall 3012 and the second barrier wall 3013 and the second metal layer structure of the source/drain electrode 312 are formed at a same layer and have a same multilayer structure, so that in a process of manufacturing the display substrate 300, the first metal layer structures of the first barrier wall 3012 and the second barrier wall 3013 and the second metal layer structure of the source/drain electrode 312 may be formed by using a same film layer. In some examples, both the first metal layer structure and the second metal layer structure may have the multilayer structure such as a double-layer structure or a triple-layer structure.

Figure 10:
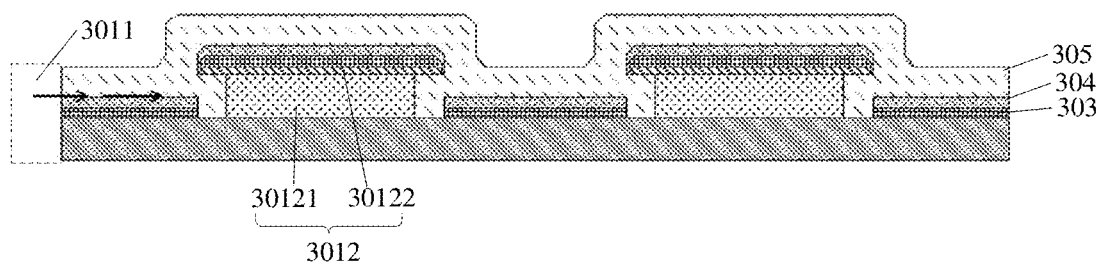
FIG. 10 is a schematic sectional view of a barrier wall in a display substrate according to another embodiment of the present disclosure.
Figure 11:
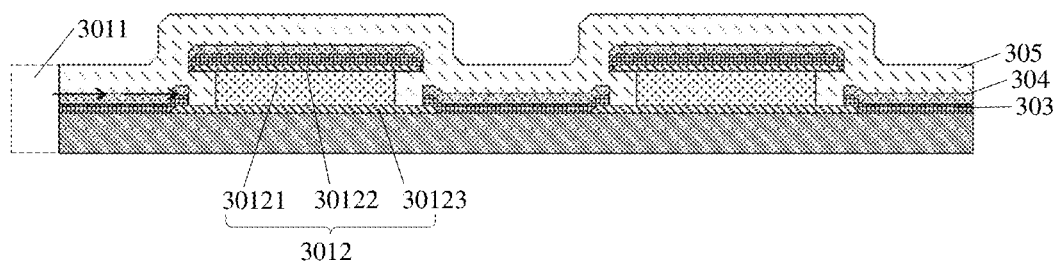
FIG. 11 is a schematic sectional view of a barrier wall in a display substrate according to another embodiment of the present disclosure.

In this embodiment, as shown in FIG. 10 and FIG. 11, the first metal layer structures of the first barrier wall 3012 and the second barrier wall 3013 are basically the same as that in the foregoing embodiment. For detailed description, refer to the foregoing embodiment, wherein similar reference numerals represent a same structure, and are not repeated in this embodiment.

As shown in FIG. 9B, the display substrate 300 further includes a base substrate 302, and the base substrate 302 is provided with a hole 3021 located in the hole area 3011. An opening direction of the notch in the first metal layer structures of the first barrier wall 3012 and the second barrier wall 3013 is parallel to the base substrate 202.

The display substrate 300 further includes an image sensor and/or an infrared sensor. The image sensor and/or the infrared sensor are integrated on the base substrate 302, for example, integrated on a side, away from a light emitting device, of the base substrate 302, and an orthogonal projection on the base substrate 302 at least partially overlaps the hole area 3011. For example, the image sensor and/or the infrared sensor are/is disposed at a position indicated by the reference number 310 in the figure. As a result, the image sensor and/or the infrared sensor may implement a function such as image acquisition, face recognition, or infrared sensing through the hole area 3011.

Similarly, in some examples in this embodiment, the display substrate 300 may further include a structure such as a second insulating layer 316 covering a capacitor, a planarization layer 317 for planarizing a drive circuit, a pixel defining layer 319 for defining a pixel array, and a columnar spacer 308 for forming packaging space, a packaging layer 305 for sealing, a second packaging layer 306 and a third packaging layer 307 for further improving a packaging effect, which are not repeated in this embodiment of the present disclosure. In an example in this embodiment, because one of the source/drain 312 of the thin film transistor is connected to the first electrode layer 318, the thin film transistor may be a drive transistor, that is, a value of a light emitting current flowing through the light emitting device is controlled based on an applied data signal, so as to control a gray scale of a pixel unit in a display process.

Figure 9C:
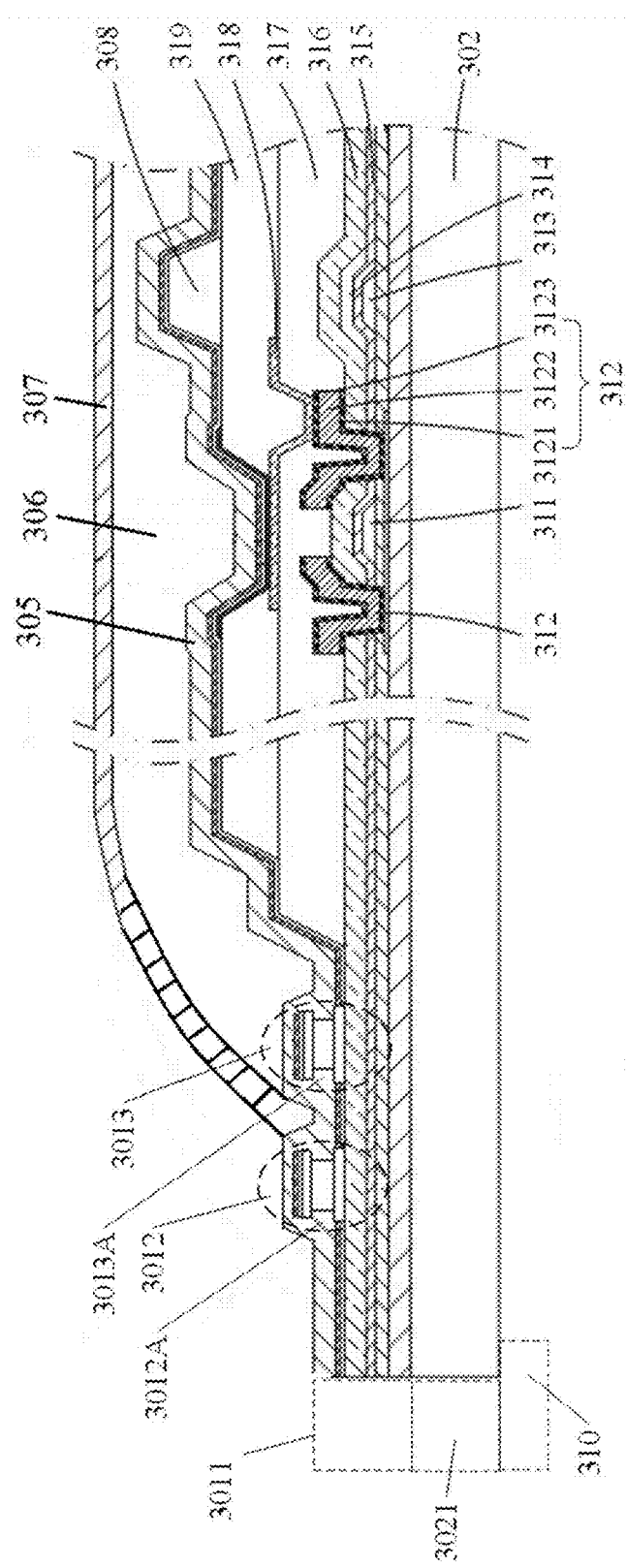
FIG. 9C is another schematic sectional view of the display substrate in FIG. 9A along a line C-C.

The packaging layer 305 is an inorganic packaging layer, including a material such as silicon oxide or silicon nitride. The second packaging layer 306 is an organic packaging layer, including an organic material such as polyimide. The third packaging layer 307 is an inorganic packaging layer, including a material such as silicon oxide or silicon nitride. In an example in FIG. 9B, the packaging layer 305, the second packaging layer 306, and the third packaging layer 307 all extend to a side, proximal to the hole area 3011, of the first barrier wall 3012, so that the three packaging layers are all used to package the first barrier wall 3012 and the second barrier wall 3013. In another example, as shown in FIG. 9C, the packaging layer 305 extends to the side, proximal to the hole area 3011, of the first barrier wall 3012, and both the second packaging layer 306 and the third packaging layer 307 terminate between the first barrier wall 3012 and the second barrier wall 3013. In some examples, the packaging layer 305 and the third packaging layer 307 may also extend to the side, proximal to the hole area 3011, of the first barrier wall 3012, and only the second packaging layer 306 terminates between the first barrier wall 3012 and the second barrier wall 3013. In some examples, the packaging layer 305 and the third packaging layer 307 may also extend to the side, proximal to the hole area 3011, of the first barrier wall 3012, and only the second packaging layer 306 terminates on a side, proximal to the display area 301, of the second barrier wall 3013. In this embodiment of the present disclosure, specific disposing of the packaging layers is not limited.

In some embodiments of the present disclosure, in addition to the first metal layer structure described above, the first barrier wall further includes, for example, an insulating layer structure. The first metal layer structure is stacked on the insulating layer structure, to form the first barrier wall having a structure with more layers, to enhance a barrier effect.

An embodiment of the present disclosure provides a display apparatus, including the display substrate described above. The display apparatus includes, but is not limited to, components such as a radio frequency unit, a network module, an audio output unit, an input unit, a sensor, a display unit, a user input unit, an interface unit, a memory, a processor, and a power supply. Those skilled in the art may understand that the structure of the display apparatus described above does not constitute a limitation on the display apparatus, and the display apparatus may include more or fewer components described above, or some components are combined, or different component deployments are used. In this embodiment of the present disclosure, the display apparatus includes, but is not limited to, a display, a mobile phone, a tablet computer, a television, a wearable electronic device, a navigation display device, and the like.

The display apparatus may be any product or component with a display function such as a television, a monitor, a digital photo frame, a mobile phone, or a tablet computer, wherein the display apparatus further includes a flexible circuit board, a printed circuit board, and a backplane.

In the method embodiments of the present disclosure, the sequence numbers of the steps cannot be used to limit the sequence of the steps. Changes made by those of ordinary skill in the art to the sequence of the steps without creative efforts shall fall within the protection scope of the present disclosure.

It should be noted that the various embodiments in this specification are described in a progressive manner, same or similar parts between the various embodiments can be referred to each other, and each embodiment focuses on the differences from other embodiments. In particular, the embodiment is basically similar to the product embodiment, and therefore, is relatively briefly described. For related parts, refer to a part of the description of the product embodiment.

Unless otherwise defined, all technical terms or scientific terms used in the present disclosure should be ordinary meanings understood by those of ordinary skill in the art to which the present disclosure belongs. The "first", "second", and similar words used in the present disclosure do not indicate any order, number, or importance, but are only used for distinguishing different components. Similar words such as "include" and "comprise" mean that elements or objects appearing before the word cover elements or objects and their equivalents listed after the word, but do not exclude other elements or objects. Similar words such as "connected" and "connection" are not limited to a physical or mechanical connection, but may include an electrical connection, whether direct or indirect. "Up", "down", "left", "right", or the like is only used to indicate a relative position relationship. When an absolute position of a described object changes, the relative position relationship may also change accordingly.

It may be understood that when an element such as a layer, film, region, or substrate is referred to as being "on" or "under" another element, the element can be "directly" on or "under" the other element, or there may be an intermediate element.

In the description of the foregoing embodiments, specific features, structures, materials, or characteristics may be combined in any one or more embodiments or examples in an appropriate manner.

The foregoing is only specific implementations of the present disclosure, but the protection scope of the present disclosure is not limited thereto. All changes or replacements that can be readily figured out by any person skilled in the art within the technical scope disclosed in the present disclosure shall fall within the protection scope of the present disclosure. Therefore, the protection scope of the present disclosure should be subject to the protection scope of the claims.

The invention claimed is:

1. A method for manufacturing a display substrate, wherein the display substrate comprises a display area, a barrier wall disposing area, and a hole area, the display area surrounds the barrier wall disposing area, the barrier wall disposing area surrounds the hole area, and the method comprises:
   removing, after a first electrode of a light emitting device of the display substrate is formed, a protective layer of the barrier wall disposing area, and exposing at least one circle of an initial barrier wall covered by the protective layer, wherein the initial barrier wall is disposed around the hole area; and
   etching the at least one circle of the initial barrier wall, to form at least one circle of a barrier wall, wherein a notch is formed on at least one side surface of the barrier wall;
   wherein the removing a protective layer of the barrier wall disposing area comprises:
      coating a photoresist on the display substrate on which the first electrode is formed, and exposing the photoresist by using a mask, wherein the mask comprises a translucent pattern corresponding to the barrier wall disposing area;
      removing the photoresist of the barrier wall disposing area after development; and
      performing dry etching on the protective layer of the barrier wall disposing area by using a remaining photoresist as a mask, removing the protective layer of the barrier wall disposing area, and exposing the initial barrier wall.

2. The method for manufacturing the display substrate according to claim 1, wherein before the removing a protective layer, covering an initial barrier wall, of the barrier wall disposing area, the method further comprises:

forming, in the barrier wall disposing area, the at least one circle of the initial barrier wall surrounding the hole area; and forming the protective layer covering the initial barrier wall.

3. The method for manufacturing the display substrate according to claim 2, wherein the method further comprises:

forming a conductive pattern of the display substrate while the initial barrier wall is formed, wherein the conductive pattern and the initial barrier wall are formed by using a same film layer.

4. The method for manufacturing the display substrate according to claim 3, wherein the forming the initial barrier wall and a conductive pattern comprises:

forming a first metal material layer on a first side of a base substrate of the display substrate, and forming a second metal material layer on a side, away from the base substrate, of the first metal material layer; and performing first etching on the first metal material layer and the second metal material layer, to form the conductive pattern and the initial barrier wall.

5. The method for manufacturing the display substrate according to claim 4, wherein the etching the at least one circle of the initial barrier wall, to form at least one circle of a barrier wall comprises:

performing wet etching on the initial barrier wall, wherein an etch rate at which the first metal material layer is etched by using an etchant is greater than an etch rate at which the second metal material layer is etched by using the etchant, and forming the notch.

6. The method for manufacturing the display substrate according to claim 3, wherein the forming the initial barrier wall and a conductive pattern comprises:

sequentially forming a third metal material layer, a first metal material layer, and a second metal material layer on a first side of a base substrate of the display substrate; and performing first etching on the third metal material layer, the first metal material layer, and the second metal material layer, to form the conductive pattern and the initial barrier wall.

7. The method for manufacturing the display substrate according to claim 6, wherein the etching the at least one circle of the initial barrier wall, to form at least one circle of a barrier wall comprises:

performing wet etching on the initial barrier wall, wherein an etch rate at which the first metal material layer is etched by using an etchant is greater than an etch rate at which the second metal material layer is etched by using the etchant and an etch rate at which the third metal material layer is etched by using the etchant, and forming the notch.

8. The method for manufacturing the display substrate according to claim 4, wherein the first etching is dry etching.

9. The method for manufacturing the display substrate according to claim 1, wherein the mask further comprises a translucent pattern corresponding to the hole area, and while the photoresist of the barrier wall disposing area is removed after development, a photoresist of the hole area is further removed.

10. The method for manufacturing the display substrate according to claim 3, wherein the forming a conductive pattern of the display substrate while the initial barrier wall is formed comprises:

while the initial barrier wall is formed, forming a first source-drain metal layer pattern of the display substrate; or while the initial barrier wall is formed, forming a second source-drain metal layer pattern of the display substrate.

11. The method for manufacturing the display substrate according to claim 2, wherein the forming the protective layer covering the initial barrier wall comprises:

forming a passivation layer or a planarization layer covering the initial barrier wall.

12. The method for manufacturing the display substrate according to claim 1, wherein after the forming at least one circle of a barrier wall, the method further comprises:

forming an organic function layer of the light emitting device, wherein the organic function layer is disconnected on the side surface, on which the notch is provided, of the barrier wall;

forming a second electrode of the light emitting device; and forming a packaging thin film layer covering the display substrate on which the light emitting device is formed.

13. The method for manufacturing the display substrate according to claim 12, wherein the hole area is formed through laser cutting or mechanical stamping.

14. A display substrate, manufactured by using the method according to claim 1, wherein the display substrate comprises a display area, a barrier wall disposing area, and a hole area, the display area surrounds the barrier wall disposing area, the barrier wall disposing area surrounds the hole area, at least one circle of a barrier wall surrounding the hole area is disposed in the barrier wall disposing area, and a notch is formed on at least one side surface of the barrier wall.

15. The display substrate according to claim 14, wherein the barrier wall comprises:

a first metal pattern, arranged on a first side of a base substrate of the display substrate; and a second metal pattern, arranged on a side, away from the base substrate, of the first metal pattern, wherein an orthogonal projection of the first metal pattern on the base substrate falls within an orthogonal projection of the second metal pattern on the base substrate, and the notch is formed.

16. The display substrate according to claim 15 wherein the barrier wall further comprises:

a third metal pattern, arranged on the first side of the base substrate, wherein the first metal pattern is arranged on a side, away from the base substrate, of the third metal pattern, and the orthogonal projection of the first metal pattern on the base substrate falls within an orthogonal projection of the third metal pattern on the base substrate;

wherein a thickness of the first metal pattern is greater than a thickness of the second metal pattern and a thickness of the third metal pattern;

wherein the thickness of the first metal pattern is 150 nm to 900 nm, the thickness of the second metal pattern is 30 nm to 300 nm, and the thickness of the third metal pattern is 30 nm to 300 nm.

17. The display substrate according to claim 15, wherein a material of the first metal pattern comprises aluminum or copper; and a material of the second metal pattern comprises titanium or molybdenum.

18. The display substrate according to claim 14, wherein an opening direction of the notch is parallel to a base substrate of the display substrate; or the display substrate further comprises an image sensor and/or an infrared sensor, wherein the image sensor and/or the infrared sensor are integrated on a base substrate of the display substrate, and an orthogonal projection on the base substrate at least partially overlaps the hole area.

19. A display apparatus, comprising the display substrate according to claim 14.

\* \* \* \* \*